US010712419B2

(12) United States Patent
Xu

(10) Patent No.: US 10,712,419 B2
(45) Date of Patent: Jul. 14, 2020

(54) SELECTIVE SIZE IMAGING USING FILTERS VIA DIFFUSION TIMES

(71) Applicant: VANDERBILT UNIVERSITY, Nashville, TN (US)

(72) Inventor: Junzhong Xu, Nashville, TN (US)

(73) Assignee: Vanderbilt University, Nashville, TN (US)

(*) Notice: Subject to any disclaimer, the term of this patent is extended or adjusted under 35 U.S.C. 154(b) by 0 days.

(21) Appl. No.: 16/274,766

(22) Filed: Feb. 13, 2019

(65) Prior Publication Data

US 2019/0250235 A1 Aug. 15, 2019

Related U.S. Application Data

(60) Provisional application No. 62/629,869, filed on Feb. 13, 2018.

(51) Int. Cl.

| | |
|---|---|
| ***G01V 3/00*** | (2006.01) |
| ***G01R 33/563*** | (2006.01) |
| ***G06T 7/00*** | (2017.01) |
| ***G06T 11/00*** | (2006.01) |
| *G01R 33/56* | (2006.01) |

(52) U.S. Cl.

CPC ...... *G01R 33/56341* (2013.01); *G06T 7/0012* (2013.01); *G06T 11/006* (2013.01); *G01R 33/5608* (2013.01); *G06T 2210/41* (2013.01)

(58) Field of Classification Search

USPC .......................................................... 324/307

See application file for complete search history.

(56) References Cited

U.S. PATENT DOCUMENTS

| | | | | |
|---|---|---|---|---|
| 6,842,000 | B2 * | 1/2005 | Norris | G01R 33/56509 324/309 |
| 9,404,986 | B2 * | 8/2016 | White | G01R 33/48 |
| 2005/0068031 | A1 * | 3/2005 | Frank | G01R 33/56341 324/309 |
| 2010/0004527 | A1 * | 1/2010 | Dale | G01R 33/56341 600/410 |
| 2011/0282183 | A1 * | 11/2011 | Song | A61B 5/055 600/410 |
| 2012/0280686 | A1 | 11/2012 | White et al. | |
| 2015/0153433 | A1 | 6/2015 | Paulsen et al. | |
| 2019/0150822 | A1 * | 5/2019 | Wang | A61B 5/4064 |

FOREIGN PATENT DOCUMENTS

| | | |
|---|---|---|
| WO | 2017-008262 A1 | 1/2017 |

* cited by examiner

*Primary Examiner* — Rodney E Fuller

(74) *Attorney, Agent, or Firm* — Blank Rome LLP

(57) ABSTRACT

Systems and methods for cell size imaging using MRI systems are provided. An exemplary method includes obtaining first diffusion MRI data for biological tissues of interest and at least one second diffusion MRI data for the biological tissues of interest having a different diffusion time than the first diffusion MRI data. The method also includes calculating, from the first and at least one second diffusion MRI data, incremental area under curve values of the first and at least one second diffusion MRI data for a chosen diffusion time range. Thereafter, an image for the biological tissues of interest is generated, wherein intensity values for each of the plurality of image voxels is based on a corresponding one of the incremental area under curve values.

20 Claims, 17 Drawing Sheets dendrite,axon,....

Cell body of neurons and glia

Cancer cell

SELECTIVE SIZE IMAGING USING FILTERS VIA DIFFUSION TIMES

CROSS-REFERENCE TO RELATED APPLICATIONS

This application claims priority to U.S. Provisional Application No. 62/629,869, entitled, "Selective Size Imaging Using Filters Via Diffusion Times," filed Feb. 13, 2018, the contents of which are incorporated herein by reference.

FIELD OF THE INVENTION

The present invention relates to magnetic resonance imaging (MRI) and more particularly to the apparatus and methods for cell size imaging using MRI systems.

BACKGROUND

Cancer patients who develop brain tumors (primary and metastatic) need imaging of their tumors with high accuracy and resolution to appropriately analyze the tumors. This imaging can also be used to plan for stereotactic radiosurgery (SRS) treatment. Radiation damage to surrounding brain tissues during SRS treatment is a grave risk. Therefore, there is a need for more accurate imaging technology so patients are appropriately treated and do not need to undergo unnecessary additional radiation treatment.

Current methods of imaging tumors rely on gadolinium-based contrast agents. However, these methods have several shortcomings. First, patients with renal dysfunction cannot use gadolinium (Gd) as a contrast agent because gadolinium injections into the body could cause patients with renal dysfunction to develop nephrogenic systemic fibrosis. Second, there are increasing safety concerns over Gd deposition in the human body such as in the brain. Third, gadolinium-MRIs do not accurately distinguish against what tissue might be a tumor because gadolinium-MRIs only identify cell growths that break the blood brain barrier (BBB). Therefore, Gd-based methods cannot reliably detect the borders of a potential tumor which does not break the BBB. Additionally, Gd-based methods cannot reliably differentiate tumors from other lesions that broke the BBB.

Other potential imaging techniques, such as diffusion-weighted MRI (DWI) and diffusion tensor imaging (DTI), which is a specific imaging technique based on DWI, rely on mapping the diffusion of water molecules to generate contrast in MRI images and identify different tissue microstructures. These techniques, while able to identify areas of interest in the tissue, cannot differentiate between tumors and radionecrosis, which is localized tissue damage caused by exposure to ionizing radiation. Failing to distinguish between radionecrosis and a tumor means that doctors cannot accurately provide treatment without the need for additional follow-up tests to identify which type of tissue the MRI had detected. Further, although SRS treatment is often prescribed for tumors, incorrectly diagnosed SRS treatment can cause further radionecrosis.

What is needed is a non-invasive imaging method to assess cell size and differentiate between radionecrosis and cancerous cells.

SUMMARY

The various embodiments of the present invention relate to MRIs and more specifically to apparatus and methods for cell size imaging using MRI systems.

According to an exemplary embodiment of the invention, the method is directed towards a new methodology called Selective Size Imaging using Filters via diffusion Times (SSIFT). SSIFT provides a highly specific approach for imaging tumors with the capability to distinguish tumors from other brain etiologies. S SIFT functions by identifying cell size through detecting the rates of diffusion for different cells. Tumors typically have much larger cell sizes than cells in surrounding tissues. Therefore, SSIFT is an MRI scan process which identifies cell size of interest and can effectively diagnose whether further SRS treatment is required for a patient.

Although only particular embodiments for S SIFT are described in the present disclosure, the exemplary embodiments described below merely constitute examples that do not limit the subject matter of the invention. All the features described above and in the following are advantageous both alone and in any combination with each other.

In a first embodiment of the present disclosure (and of SSIFT), a method can provide for evaluating biological tissues using magnetic resonance imaging (MRI). The method can first provide for obtaining first diffusion MRI data for biological tissues of interest. The method can then provide for obtaining a second diffusion MRI data for the biological tissues of interest. The second diffusion MRI data can have a different diffusion time than the first diffusion MRI data. In some examples, any number of additional diffusion MRI data can be obtained for the biological tissues of interest, where each additional diffusion MRI data has a different diffusion time than any of the previous diffusion MRI data. The method can then calculate, from all of the diffusion MRI data, incremental area under curve values of the first and at least one second diffusion MRI data for a chosen diffusion time range. The method can then provide for generating an image for the biological tissues of interest. This image can include a plurality of image voxels, where intensity values for each of the plurality of image voxels can be based on a corresponding one of the incremental area under curve values.

A second embodiment of the present disclosure can provide for a non-transitory computer-readable storage medium. The storage medium can store a computer program, which can be executable by a computing device. The computer program can include a plurality of code sections for cause the computing device to perform the method of the first embodiment.

A third embodiment of the present disclosure can provide for a non-transitory computer-readable storage medium and a processor. The storage medium can store a computer program, which can be executable by the processor. The computer program can include a plurality of code sections for cause the processor to perform the method of the first embodiment.

DETAILED DESCRIPTION

Figure 1A:
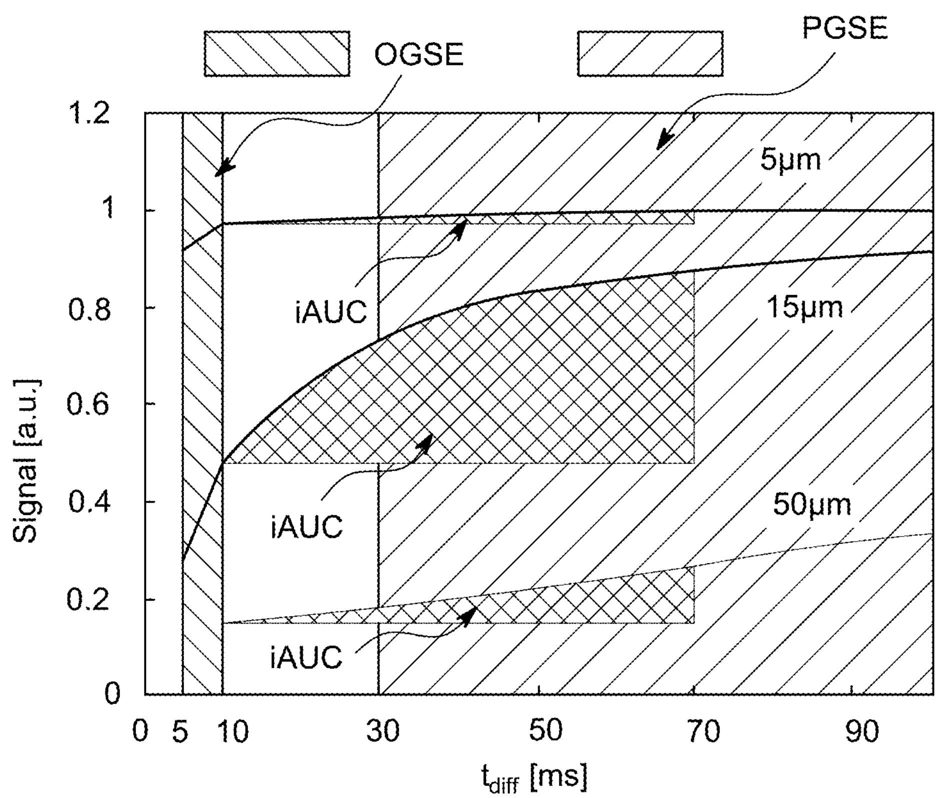
FIG. 1A shows an X-Y plot of the simulated dependency of diffusion-weighted MRI (DWI) signals on cell size and diffusion time.

The present invention is described with reference to the attached figures, wherein like reference numerals are used throughout the figures to designate similar or equivalent elements. The figures are not drawn to scale and they are provided merely to illustrate the instant invention. Several aspects of the invention are described below with reference to example applications for illustration. It should be understood that numerous specific details, relationships, and methods are set forth to provide a full understanding of the invention. One having ordinary skill in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

SSIFT can evaluate biological tissues using magnetic resonance imaging (MRI). SSIFT provides for obtaining first diffusion MRI data for biological tissues of interest and then obtaining at least one second diffusion MRI data for the biological tissues of interest. The second (and any additional scans) diffusion MRI data can have a different diffusion time than the first diffusion MRI data. SSIFT can then calculate, from all the diffusion MRI data, incremental area under curve values of the diffusion MRI data. SSIFT can then provide for generating an image for the biological tissues of interest. This image can include a plurality of image voxels, where intensity values for each of the plurality of image voxels can be based on a corresponding one of the incremental area under curve values.

The present disclosure provides an imaging method capable of making a non-invasive assessment of differentiating between radionecrosis and cancerous cells. Therefore, systems and methods according to the present disclosure can provide a valuable tool, for both animals and humans, in both brain tissue and other body organs, for tissue and disease characterization, mechanistic explorations, diagnostics and assessment of treatment response.

Water molecules reside in biological tissues, including within cancer cells, glial cells, neurons, or in the interstitial fluid in the brain. A smaller cell size leads to more restriction in water diffusion and a larger cell size will lead to less restriction in water diffusion. Cancer cells usually have a larger cell size as well as less restriction to diffusion than other types of cells in the brain, but much higher restriction to diffusion compared with free fluid. Therefore, water diffusion can be measured by a diffusion-weighted MRI scan (DWI) to infer the information on cell size. This is shown below in FIGS. 1A and 1B.

FIG. 1A is an X-Y plot of the simulated dependency of DWI on cell size and diffusion time. FIG. 1A demonstrates how the incremental area under curve (iAUC) shows a strong dependence on cell size. Three representative restriction sizes (5, 15, and 50 μm) are measured for a clinically achievable range of $t_{diff}$ to show how the DWI signal depends on the cell size.

FIG. 1A also demonstrates the improved sensitivity of the oscillating gradient spin echo (OGSE) to the pulsed gradient spin echo (PGSE) used in conventional MRI scans. PGSE acquisitions must employ long $t_{diff}$ due to hardware limitations and thus the technology has limited ability to adjust detection sensitivity. This is demonstrated by the region in the figure identified as PGSE. For the detection of cancer cells with 10-25 μm cell sizes, SSIFT works best with OGSE acquisitions which allow detection sensitivity to use a much shorter $t_{diff}$ which would not be accessible with PGSE on regular clinical MRI systems. This is demonstrated by the shaded OGSE region in FIG. 1A which displays a very short $t_{diff}$. However, SSIFT is not limited to OGSE acquisitions. For larger cell sizes, two or more diffusion scans with different $t_{diff}$ can still detect cancer cells by using PGSE acquisitions only or using stimulated echo acquisition mode (STEAM) diffusion MRI (STEAM-DWI).

Figure 1B:
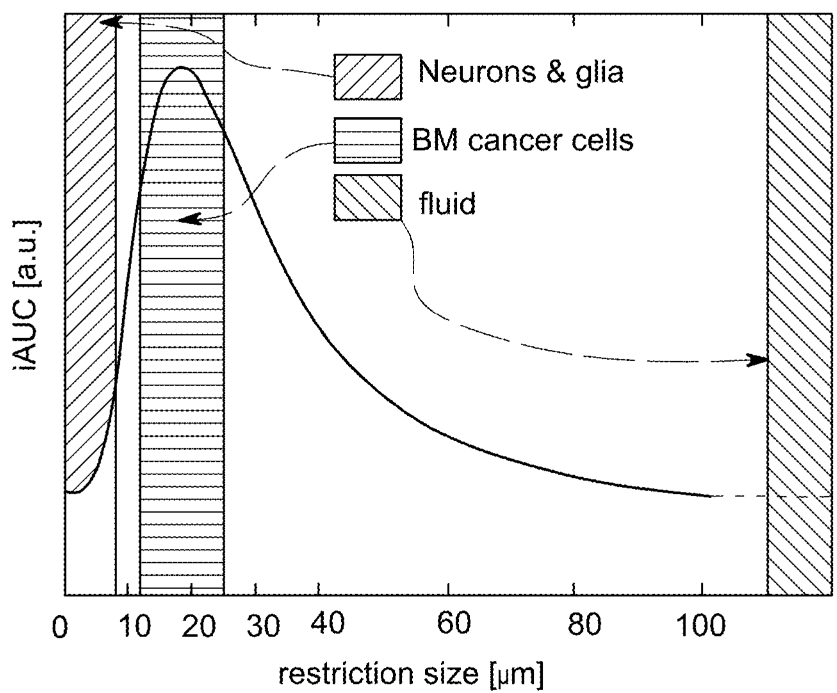
FIG. 1B shows a normalized incremental area under curve (iAUC) dependent on cell size.

FIG. 1B shows how the iAUC depends on cell size and peaks at around 20 μm for the range of $t_{diff}$ 10-70 ms (of FIG. 1A). Typical cancer cell size is between 15 and 25 FIG. 1B also shows how the iAUC approaches zero when cell size is small (<5 μm) or large (>50 μm). This X-Y plot demonstrates how the normalized iAUC between $t_{diff}$=70 ms (PGSE) and 10 ms (OGSE) can serve as a filter to selectively image specific restriction sizes that are close to typical cancer cell sizes. This range for $t_{diff}$ is also considered the clinically achievable range. By contrast to cancer cell size, normal brain cells are relatively much smaller. For example, the majority of brain cells are glia cells with a reported average size of 5.26±0.07 μm while the diameter of most neuron axons in the brain is smaller than 3 μm. Thus, in the shaded region on the far left, the plot shows the potential restriction size for cancer cells and how the shaded region for cancer cells has a very different iAUC result than the shaded region for neuron & glia cells. The plot also shows a different iAUC result than for fluid in edema or cyst.

Figure 2:
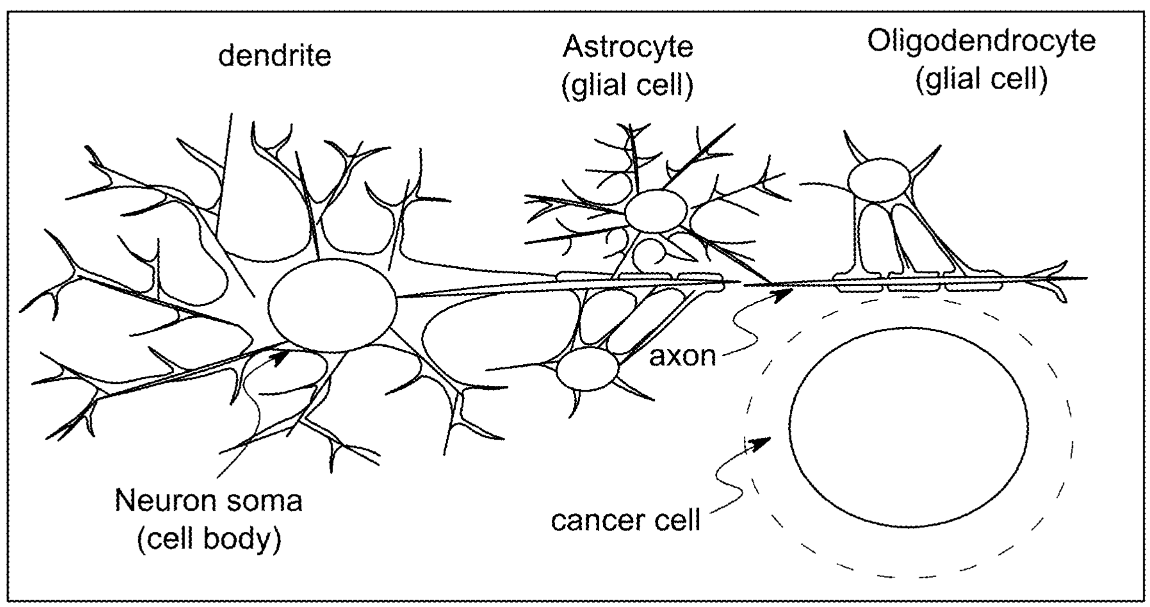
FIG. 2 is a diagram showing the local diffusion tensors of brain and cancer cells.

FIG. 2 displays a diagram of three categories of restricted diffusion in the brain based on the local diffusion environment. Water molecules reside in many different compartments of tissues, such as within cancer cells, glial cells, neurons, or in the interstitial fluid. Diffusion tensor imaging (DTI) measures diffusion of water among cells in order to generate an image of the region of interest. FIG. 2 demonstrates how cells can be separated into three categories based on the local diffusion environment. Each diffusion tensor can be described using the axial and radial diffusivities by assuming cylindrical symmetry. Assuming cylindrical symmetry simplifies the calculations even though individual cells are not perfect cylinders, ellipsoids, or spheres. FIG. 2 overlays the local diffusion tensors as ellipsoids over diagrams of the brain and cancer cells. When SSIFT measures diffusion of water among cells in the region of interest, cancer cells will produce a much larger iAUC than glial or neuron cells.

Figure 3A:
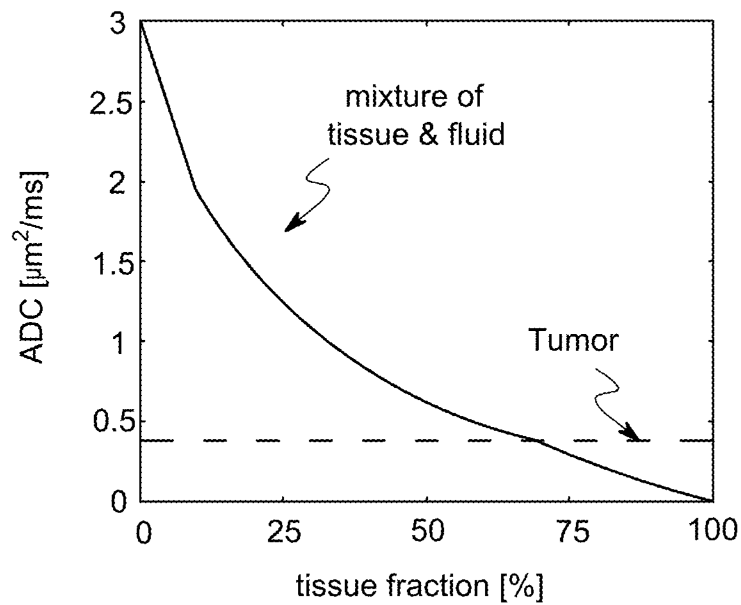
FIG. 3A shows a simulated comparison of a voxel consisting of cancer cells and a voxel consisting of mixtures of brain tissues and free fluid, according to an embodiment of the present disclosure.

FIG. 3A shows a simulated comparison of ADC of an imaging voxel consisting of 100% cancer cells (20 μm cell size) and a voxel consisting of mixtures of brain tissues (5 μm cell size) and free fluid such as in edema. Because ADCs of cancer cells are larger than those of normal brain cells but smaller than that of free fluid, ADCs of the mixture of brain tissues and fluid will always overlap with ADCs of cancer cells at a certain tissue fraction. FIG. 3A shows a roughly 70% fraction of tissues with fluid will have the same ADCs as a pure tumor tissue, suggesting that ADC cannot distinguish these two types of tissues.

Figure 3B:
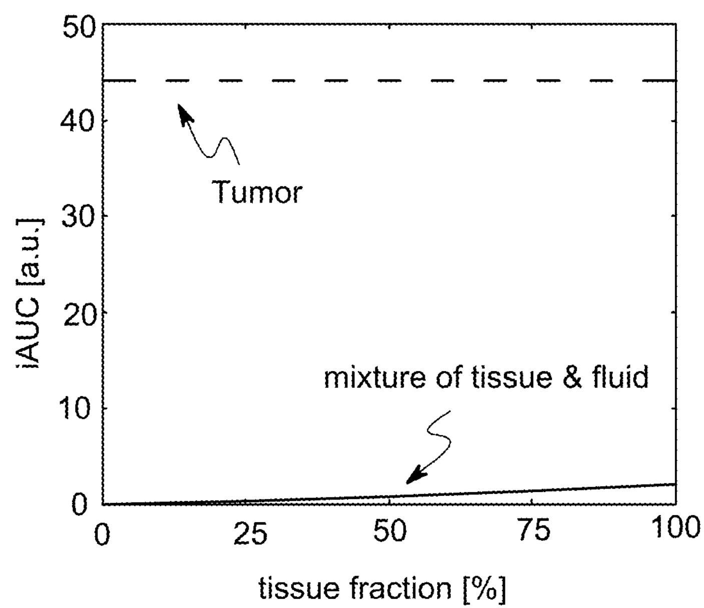
FIG. 3B shows a comparison of iAUCs of mixtures of brain tissue and fluid versus cancer cells, according to an embodiment of the present disclosure.

FIG. 3B shows that iAUCs of mixtures of normal brain tissue and fluid at any tissue fraction are always smaller than that of cancer cells. Therefore, iAUC using SSIFT provides an excellent contrast to distinguish tumors from mixtures of normal tissues and fluid at any mixing fraction ratio. This forms the basics of high sensitivity and specificity for imaging tumors using SSIFT in the presence of complex mixtures of different tissues types. Mixtures of different tissue types usually prevented conventional MRI from reliably and specifically imaging biomarkers for tumors.

SSIFT leverages differences in sensitivity to cell density so as to provide an approach for measuring cell size. This sensitivity depends on a characteristic length 1, which is the root mean square displacement of diffusing water molecules over a specific period of time. This period of time can be selected experimentally which provides an opportunity to tune detection sensitivity of an MRI scan to different characteristic length scales.

Figure 4:
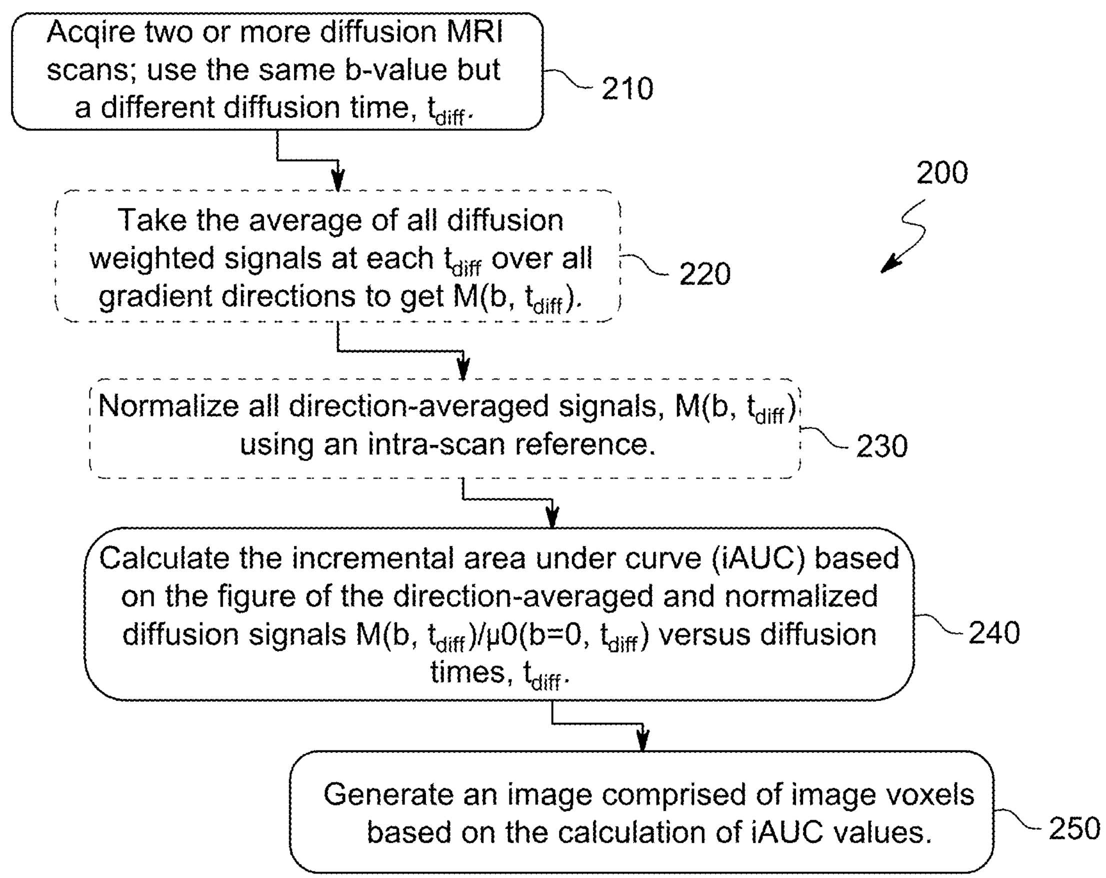
FIG. 4 is a flowchart of the methodology for SSIFT.

FIG. 4 is an exemplary flow chart of steps for implementing SSIFT. In step 210, one obtains a first diffusion MRI data for biological tissues of interest and then obtains at least one second diffusion MRI data for the same biological tissues of interest. The degree of diffusion weighting (i.e., the b-value), diffusion gradient directions, and echo times (TE) must be the same as the first diffusion MRI data but the diffusion time, $t_{diff}$, should be different. By such a means, the main differences between different MRI scans will be limited to the differences of diffusion times which are related to cell sizes. Different pulse sequences can be used in each MRI data acquisition as discussed further in relation to FIG. 5.

In step 220, SSIFT can optionally take the average of all diffusion weighted signals over all gradient directions for the diffusion MRI data from the previous step. This removes the signal dependence on tissue microstructural orientation. However, SSIFT can be used in any direction individually, or the combination of any arbitrary two or more directions. The total measured signal of diffusion MRI of each imaging voxel can be written as the sum of signals arising from all diffusion compartments. SSIFT can measure the total diffusion MRI signal as:

$$S_{total} = f_{free}e^{-bD_{free}} + f_h e^{-bD_h} + S_{\substack{dendrite\\axon}} + S_{cell\ bodies} + S_{cancer\ cell},$$

where S is the measured signal of diffusion at each listed cell type, b is the degree of diffusion weighting, $f_n$ is the water fraction, and $D_h$ is the hindered diffusion of water outside cells.

If tissues exhibit orientation inhomogeneity such as in brain and muscles, diffusion MRI signals are dependent on diffusion gradient directions. The restricted diffusion of water inside different diffusion compartments such as cancer cells and normal cells can be described by a diffusion tensor which assumes cylindrical symmetry and is split into the axial ($\lambda_{\parallel}$) and radial ($\lambda_{\perp}$) diffusivities, both of which are functions of $t_{diff}$. The diffusion signal of the $n^{th}$ local diffusion tensor can be found by solving:

$$S_{n,k}(t_{diff}) = \sum_{n}^{N_{compt}} f_n e^{-|\vec{b}_k|(\lambda_{//,n}(t_{diff})\sin^2\theta_{n,k} + \lambda_{\perp,n}(t_{diff})\cos^2\theta_{n,k})},$$

where $S_{n,k}$ is the measured signal corresponding to the $k^{th}$ diffusion gradient direction, $f_n$ is the water fraction, $t_{diff}$ is the diffusion time, $\lambda_{\perp}$ is the radial diffusivity, $\lambda_{\parallel}$ is the axial diffusivity, $\theta_{n,k}$ is the angle between the tensor and gradient direction, $N_{compt}$ is the number of diffusion compartments in the imaging voxel, and $b_k$ is the b-value of the k-th measurement.

Referring back to step 220 in FIG. 4, SSIFT can optionally remove the dependency of the calculations on gradient directions by taking the average of signals over all gradient directions for each $t_{diff}$. This is referred to as the spherical mean and can be obtained as:

$$M_n(t_{diff}) = \sum_{n}^{N_{compt}} \sum_{k}^{N_{dirs}} S_{n,k}(t_{diff}) = \sum_{n}^{N_{compt}} f_n \exp(-b\lambda_{\perp,n}(t_{diff})) \frac{\sqrt{\pi}\, erf\left(\sqrt{b(\lambda_{//,n}(t_{diff}) - \lambda_{\perp,n}(t_{diff}))}\right)}{2\sqrt{b(\lambda_{//,n}(t_{diff}) - \lambda_{\perp,n}(t_{diff}))}},$$

where $N_{dirs}$ is the number of gradient directions. The spherical mean, $M_n$, will rely on water fractions and local diffusion tensors only. Water fractions are tissue parameters that do not change with $t_{diff}$, $D_{free}$ is a constant, and the dependence of $D_h$ on $t_{diff}$ is negligible within the range of 30-70 ms, which is the time range used for $t_{diff}$ used in SSIFT's collected MRI scans.

For tensors in dendrites and axons, $\lambda_\perp$~0 due to very small diameters. $\lambda_\parallel$ is $t_{diff}$-independent due to unrestricted diffusion along main axes which includes tensors in cell bodies. $\lambda_\perp \approx \lambda_\parallel$ is $t_{diff}$-independent due to small sizes (see FIG. 2). Therefore, the main dependency of diffusion signals on $t_{diff}$ is due to restricted diffusion signals from cancer cells.

In step 230, SSIFT can optionally further remove influences of inter-scan variations and field inhomogeneity by taking diffusion measurements with different $t_{diff}$ values but the same b-value and then normalizing diffusion signals using the T2-weighted b=0 signals. SSIFT can use a clinically-obtainable $t_{diff}$ range from 10-70 ms as an appropriate filter to select signals from the typically 15-25 μm cancer cells. If smaller or larger cell sizes are interested, shorter or longer diffusion times should be chosen, respectively. Therefore, according to various embodiments of SSIFT, the selected diffusion time range for $t_{diff}$ will be varied according to the desired cell size.

In step 240 and 250, SSIFT then generates an image for the biological tissues of interest. To do so, in step 240, SSIFT calculates incremental area under the curve (iAUC) for each voxel from the first and at least one second diffusion MRI data. Qualitatively, the iAUC can be calculated for each voxel as follows:

a) An initial registration step can be performed for the two or more diffusion times for a selected time range for $t_{diff}$.
b) For each voxel, a signal versus diffusion time $t_{diff}$ curve is identified. The signal can be raw signals along one gradient direction, combinations of two or more arbitrary direction, or simply the averaged signals over all gradient direction.
c) Once the signal versus $t_{diff}$ curve is identified, the iAUC is calculated by calculating the area under the curve between the diffusion time range for the signals and the intensity between the signals. For example, as shown in FIG. 1A, the iAUC for MRI signals obtained with diffusion times of 10 ms and 70 ms are the shaded region identified.
d) The calculated iAUC is then used to define the intensity for the voxel in a subsequent image.

In step 250, an image can then be generated from the image voxels. Intensity values for each of the image voxels is based on a corresponding calculation of the incremental area under curve values. The image will show a high-contrast region with cancer cells.

Figure 5:
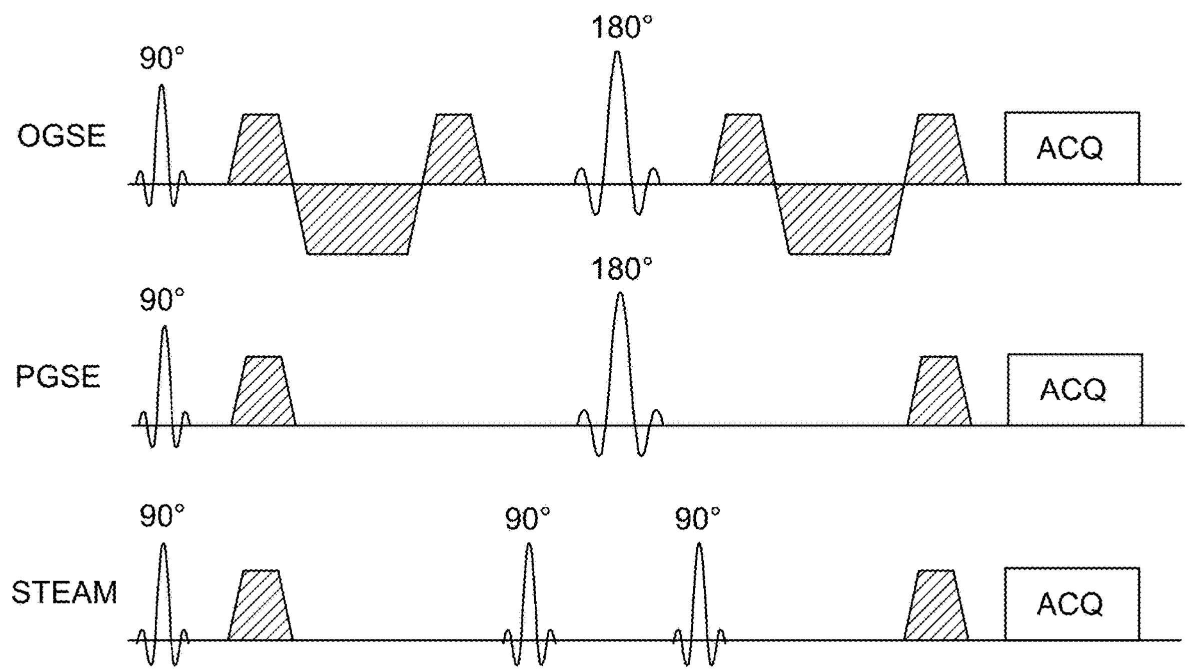
FIG. 5 shows a diagram of representative pulse sequences that could be used in SSIFT.

As a reference, FIG. 5 is a diagram of representative pulse sequences that can be used for SSIFT data acquisitions, including conventional OGSE, PGSE and STEAM-DWI sequences. As shown in FIG. 1A, OGSE acquisitions on typical human MRI scanners have a relatively short diffusion time (e.g., 10 ms), PGSE acquisitions have a relatively long diffusion time (e.g., 70 ms), while STEAM-DWI acquisitions could achieve even longer diffusion times (e.g., >100 ms).

Figure 6:
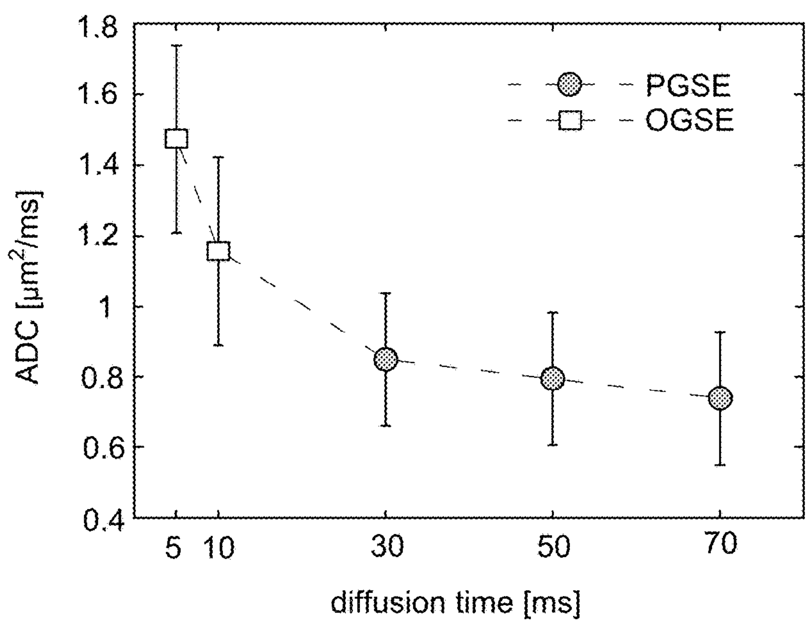
FIG. 6 is an X-Y plot of the apparent diffusion coefficient (ADC) versus diffusion time in a breast tumor.

FIG. 6 demonstrates the importance of integrating two more diffusion times over a broad range to characterize tissues. FIG. 6 shows the dependence of ADC on $t_{diff}$ of a breast ductal carcinoma from a breast cancer patient. ADC varies significantly only in the $t_{diff}$ range achievable by OGSE acquisitions in vivo. This detection is not achievable by conventional PGSE acquisitions as shown by FIG. 6 because PGSE acquisitions are not able to achieve short $t_{diff}$. This means that SSIFT can enhance the detection sensitivity to breast cancer cells through the use of OGSE.

Although FIG. 4 describes the overall methodology, the present disclosure contemplates that various improvements are possible. The following methodologies describe some additional advancements that can be optionally included in the SSIFT process.

In Vivo Example Diffusion Parameters on Clinical MRI Scanners

SSIFT can also be used two or more DTI scans with PGSE and OGSE acquisitions. In one particular example on clinical MRI scanners, the diffusion parameters can be b=1000 s/mm$^2$, δ/Δ=12/70 ms for PGSE and δ/Δ=40/45 ms, number of cycles=1 for OGSE acquisitions, resulting in diffusion times of approximately 70 and 10 ms, respectively. SSIFT can then use 32 gradient directions with 5 b=0 images interleaved. Saturation bands can suppress extracranial signals and fat saturation can suppress signal from lipids. DWI was acquired with an isotropic 2 mm resolution, TR/TE=5500120 ms, NEX=1. A single-shot EPI can reduce motion-artifacts.

Intravoxel Incoherent Motion (IVIM)

IVIM describes a pseudo-diffusion caused by microcirculation of blood in the capillary network (perfusion). The IVIM effect is more pronounced in tumors compared to normal brain tissue and can cause more signal decay at low b-values such as when b is less than 200 s/mm$^2$. IVIM may influence differently on diffusion MRI acquisitions with different diffusion times and gradient waveforms. In order to minimize the influence of IVIM, more DTI scans at b-values greater than 200 s/mm$^2$, including b=250 s/mm$^2$. SSIFT can then be used to calculate the iAUC then with the following formula: iAUC=iAUC(b=1000)−iAUC(b=250). Because the extra IVIM-induced signal decays are canceled out in this formula, the new iAUC can be used to produce a contrast image and the resultant image will have minimized the effects of IVIM.

The SSIFT process described above can suppress signals from brain tissues and other etiologies to enhance detection sensitivity to cancer cells. In addition, the accuracy of SSIFT increases the conspicuity and delineation of tumors as compared to current DTI methods. This accuracy is displayed below in FIG. 7, FIG. 8, FIG. 10, and FIG. 11.

Additionally, SSIFT does not require the use of an exogenous agent, which is required by existing standard-of-care Gd-MRI techniques. This allows a Gd-free, high-resolution MRI for cancer patients with renal dysfunction, who currently cannot receive standard-of-care GD-MRIs. Currently, other GD-free methods, such as Arterial Spin Labeling (ASL) and MR Spectroscopy Imaging (MRSI) have been used for cancer imaging, but these techniques have a poor resolution with accuracy typically >4 mm. This is problematic because SRS treatment planning usually requires MRI scans with a high spatial resolution of 1.5 mm or less to have adequate conspicuity and delineation of tumors. In contrast, SSIFT results can provide good isotropic resolution in a short time (e.g. 1.25 mm and 90 gradient directions within approximately seven minutes). It is also feasible for SSIFT to cooperate with recent diffusion MRI techniques that have allowed isotropic spatial resolution of DWI less than 0.6 μm in the human brain.

Moreover, SSIFT has advantages over other attempts to improve tumor conspicuity and delineation. While SSIFT provides specific applications of newly discovered relationships between diffusion weighted signals and cell size, SSIFT can nevertheless operate via existing commercial clinical MRI scanner hardware. Because MRI is already a part of standard-of-care for patients, SSIFT can be a simple 'add-on' to current practices. Therefore, SSIFT can provide a quick, high-resolution, high sensitivity and specificity, cost-effective, and safe (radiation and contrast agent free) cancer imaging in clinics.

EXAMPLES

The examples shown here are not intended to limit the various embodiments. Rather they are presented solely for illustrative purposes.

Figure 7:
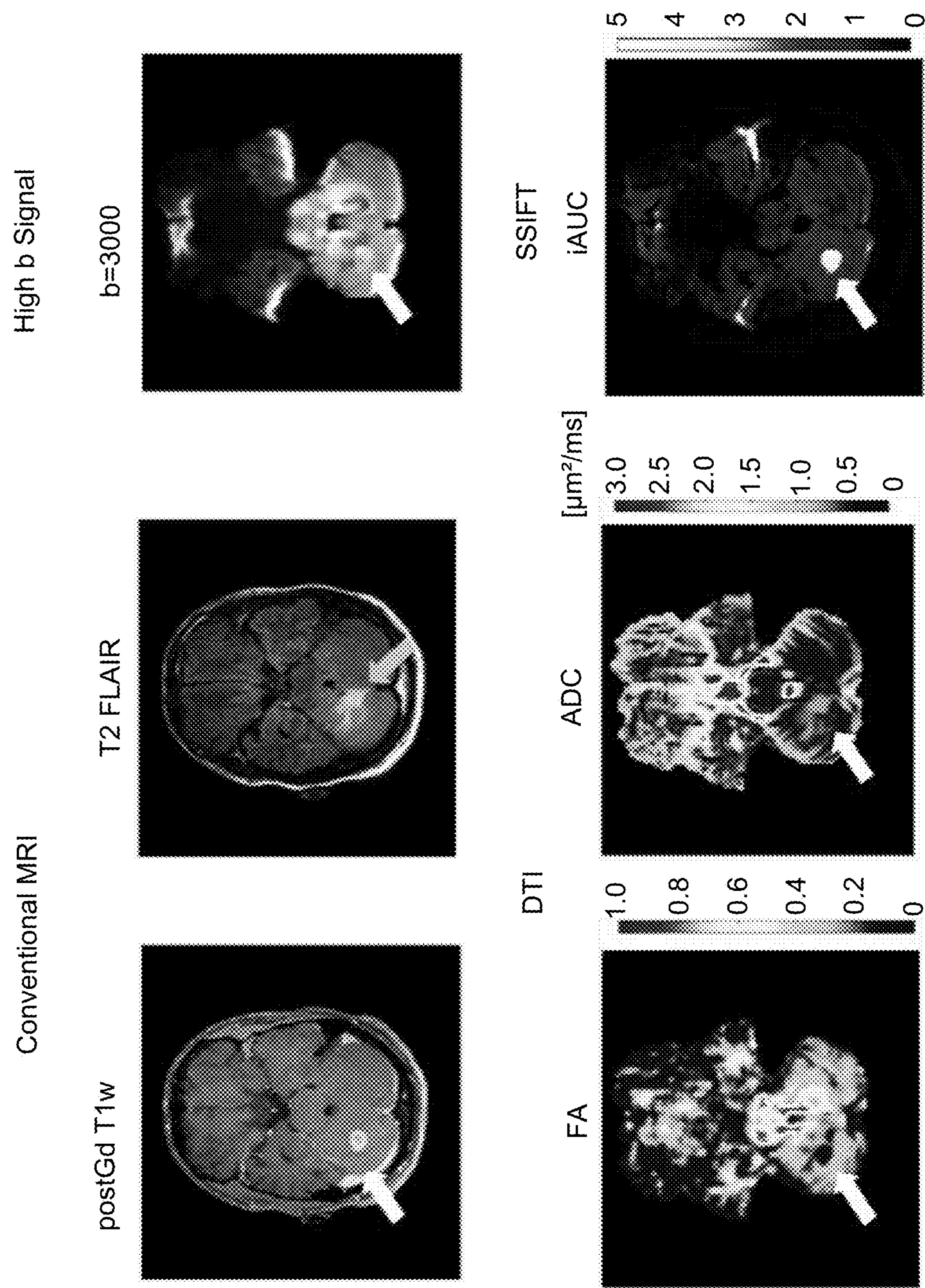
FIG. 7 shows example anatomic images from conventional MRI imaging techniques and SSIFT's imaging technique.

FIG. 7 compares multiple parametric images of a patient with a metastatic lung adenocarcinoma to the right cerebellum. The clinical stand-of-care, conventional MRI is displayed when imaging with both a post-GD T1w and T2 FLAIR. A post-GD T1w is a conventional MRI scan performed after the patient has taken GD. T1w refers to the spin-lattice relaxation time, which characterizes the rate at which the longitudinal component of the magnetization vector recovers towards its thermodynamic equilibrium. T2 FLAIR is a fluid attenuated inversion recovery which is an MRI sequence with the inversion recovery set to null fluids.

FIG. 7 shows that in conventional MRI techniques, only the post-GD imaging clearly delineates the tumor which means that patients who cannot take gadolinium will not have clearly delineated tumors. FIG. 7 also shows how conventional MRI scans have a proclivity to identify edema instead of tumors. Edema is the abnormal accumulation of fluid in the interstitium, the area beneath the skin and in the cavities of the body. The arrow in the T2 FLAIR images shows edema. The inability to correctly identify the border of a tumor negatively impacts treatment.

A conventional DTI is displayed below the conventional MRI scans, when imaged by both fractional anisotropy (FA) and ADC. FA is a measure often used in diffusion imaging to identify white matter based on the directional dependency of a diffusion process. ADC imaging shows diffusion by acquiring multiple conventional DWI images with different amounts of DWI weighting and then tracking the change in signal to show the rate of diffusion. Both conventional DTI scans fail to clearly delineate the tumor. A high b-signal scan is shown in the top right image of the figure which also fails to clearly identify or delineate the tumor. The b-factor is the degree of diffusion weighting, and higher b-factors tend to increase the sensitivity to subtle microstructural changes at a cost of a lower signal-to-noise ratio. However, even high b-factor DWI scans can fail to delineate the tumor.

As shown in FIG. 7, SSIFT provides a clear delineation of a metastatic non-small cell lung cancer (NSCLC) tumor in the right cerebellum by suppressing signals from background brain tissues, including peri-tumor vasogenic edema. The SSIFT method therefore is an ideal tool to plan SRS treatment, especially when patients cannot receive contrast enhanced MRI.

Note that in the images of FIG. 7, there are artefacts at the edges of temporal and frontal lobes. These are well-known artefacts due to the susceptibility effects seen in single-shot EPI (described later) acquisitions. Because these occur only at the edges of certain regions, they will not confound the ability SSIFT to detect tumors.

Figure 8:
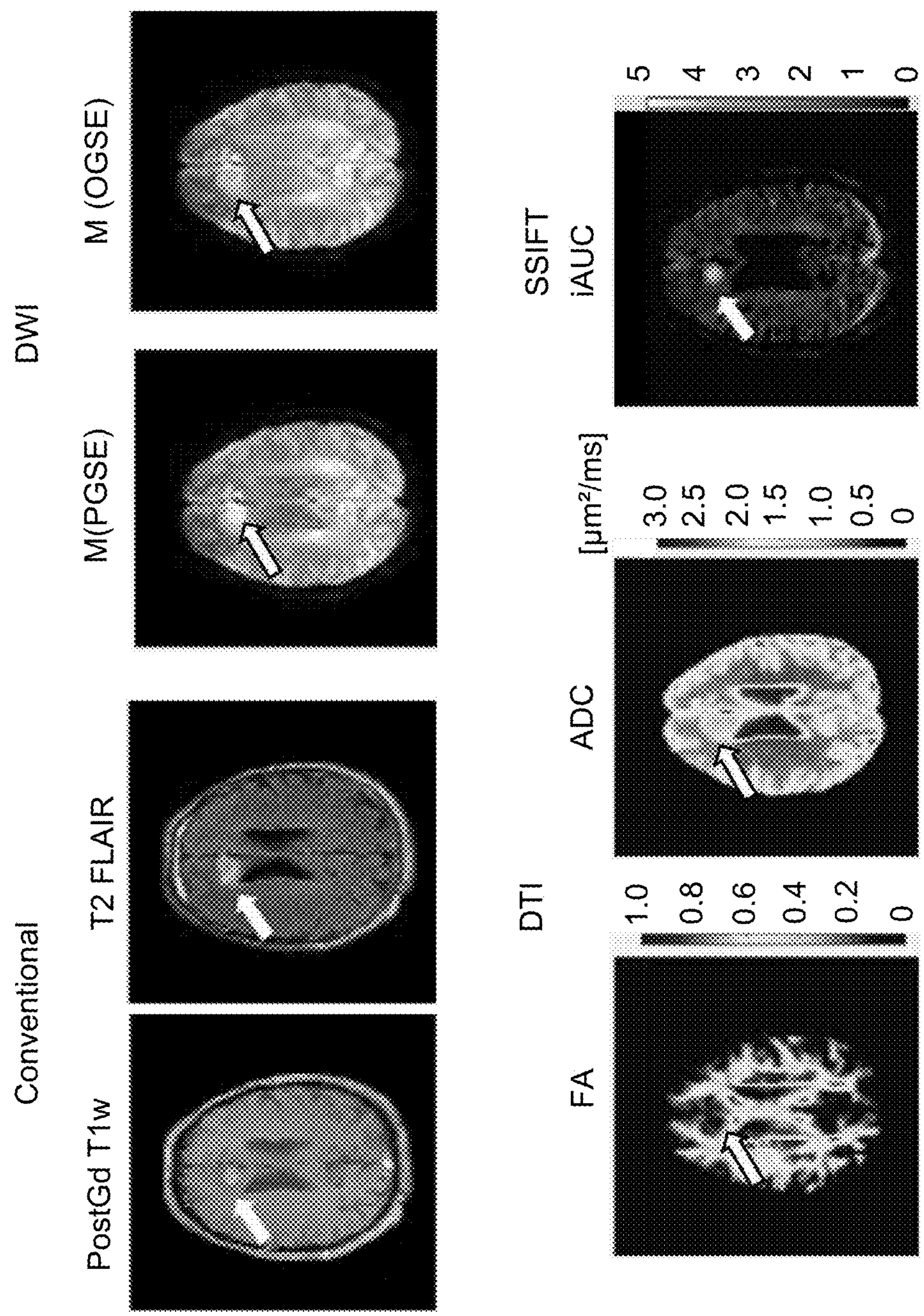
FIG. 8 shows an example anatomic image of conventional scanning methods versus SSIFT.

FIG. 8 shows representative images of a non-small cell lung cancer (NSCLC) patient with a tumor next to the right ventricle. SSIFT provides excellent conspicuity of the tumor as compared with the T2 FLAIR and the DTI images which are contaminated by vasogenic edema.

Figure 9:
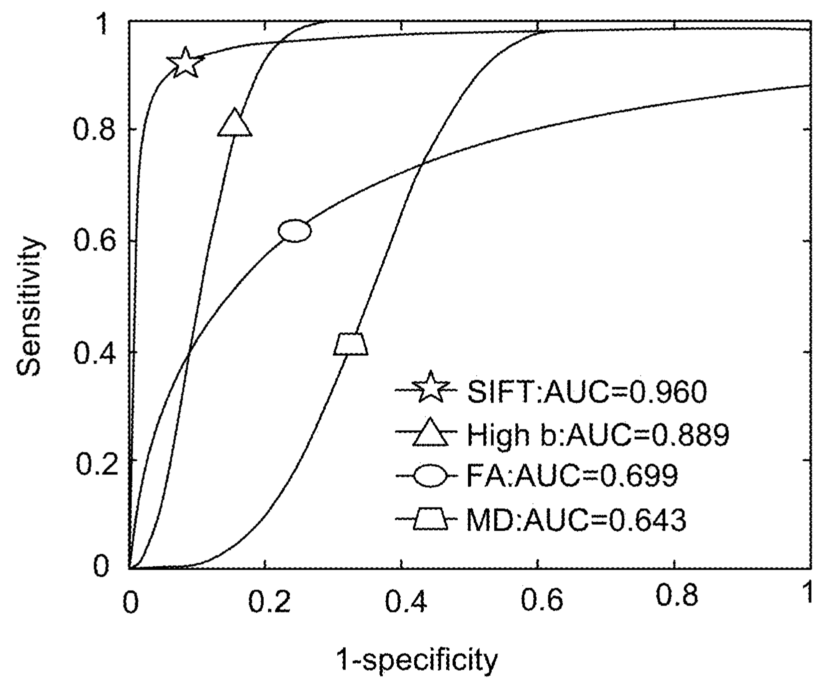
FIG. 9 is an X-Y plot comparing the receiver operating characteristics (ROC) of conventional MRI methods against SSIFT in patients.

FIG. 9 shows pixelwise receiver operating characteristic (ROC) curves of different model images from a study of a patient with NSCLC metastasis. Four different methods were used for the patient, including SSIFT; a high b-value diffusion MRI where b=3000 s/mm$^2$; and DTI-derived FA and MD (ADC). The accuracy is quantified using ROC curve analysis and calculating the area under the ROC curve (AUC). FIG. 9 shows the comparison of ROC curves for SSIFT, SSIFT with a high b-value, and the conventional Gd-free method DTI. ROC plots illustrate the diagnostic ability of a binary classifier system as its discrimination threshold, the specificity, is varied on the x-axis. The plot shows true positive rate against false positive rate in order to show the probability of a false alarm. SSIFT and the DTI methods are compared against the clinical Gd-MRI. The ideal method would have an AUC measurement as close to 1.0. As shown by the SSIFT labeled curve in FIG. 9, SSIFT has an AUC value at 0.960 and lies much closer to 1.0 than any other imaging method. Thus, SSIFT can significantly improve the sensitivity and specificity to detect tumors. FIG. 9 shows that using conventional methods using a high-b DTI achieve an AUC of 0.907; this result is lower than the AUC of SSIFT. High b-value DTI typically suffers low SNR and thus SSIFT will be more suitable for clinical usage.

Figure 10:
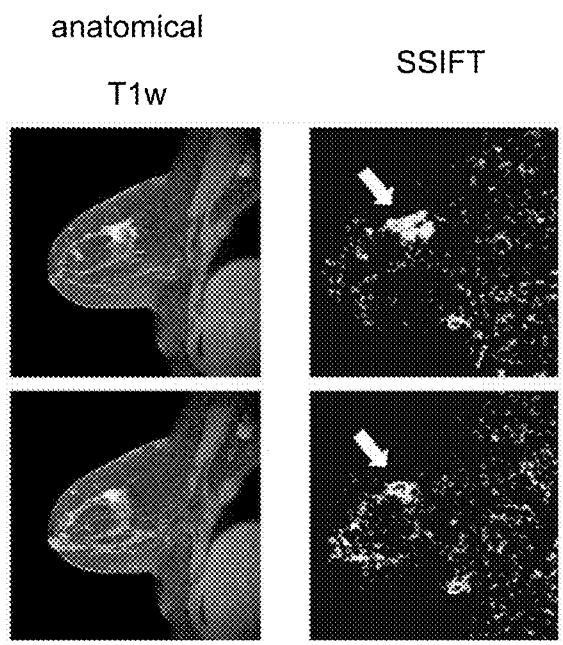
FIG. 10 shows anatomical images of breast cancer as compared between a conventional imaging method and SSIFT.

FIG. 10 shows an anatomical image of breast cancer as imaged by a conventional MRI scan and SSIFT. Again, similar to the previous example in FIG. 8 and FIG. 9, SSIFT provides accurate delineation of the breast tumors in the presence of breast tissues that typically confound the detection of breast tumors. This suggests SSIFT has applications in both intra- and extracranial tumors. Note that the low right hyper-intensity on SSIFT images are due to susceptibility-induced artefacts, which are well-known artefacts that occur at the edge of breasts so does not affect the ability of SSIFT to image breast tumors.

Examples of Tumor Detection in Animals

For animal brain imaging, SSIFT can use two or more DTI scans with PGSE and OGSE acquisitions. In one particular embodiment, the diffusion parameters can be b=1000 s/mm$^2$, $\delta/\Delta$=10/70 ms for PGSE and $\delta/\Delta$=40/45 ms for OGSE acquisitions. SSIFT can then use 32 gradient directions with 5 b=0 images interleaved. Saturation bands can suppress extracranial signals and fat saturation can suppress signal from lipids. A single-shot EPI can reduce motion-artifacts. TR/TE can be set to 5500/120 ms; field-of-view (FOV) can equal 8×8 mm, and a matrix of 64×64 yields a spatial resolution of 0.125 mm.

A volume coil can be used for a transmitter with a 4-channel phased-array coil for a receiver. An extra b=0 image with phase-encoding direction reversed can correct for EPI distortion. Slice thickness is 1 mm. The total scan time for SSIFT is ~10 minutes. This demonstrates a clinically possible SSIFT that yields a spatial resolution sufficient for SRS treatment in animals.

Figure 11:
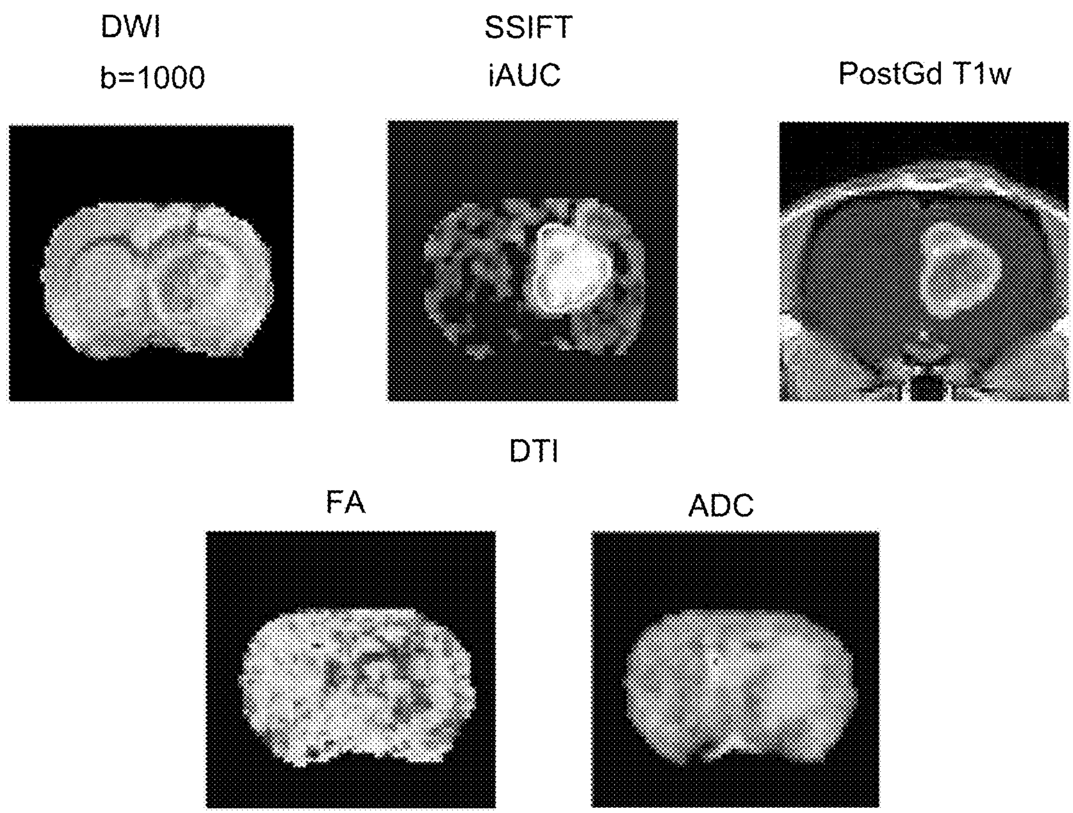
FIG. 11 shows example anatomic images of a 9 L brain tumor in animal brain as shown through SSIFT and conventional MRI imaging.

FIG. 11 shows representative images of a 9 L brain tumor xenograft in an animal brain. SSIFT provides an excellent conspicuity and delineation of the tumor comparable to post-GD T1w MRI, which is not achievable by conventional DWI or DTI. FIG. 11 shows a visual representation of the success of SSIFT against conventional MRI imaging, where SSIFT does not rely on the animal first ingesting a contrast agent.

Figure 12:
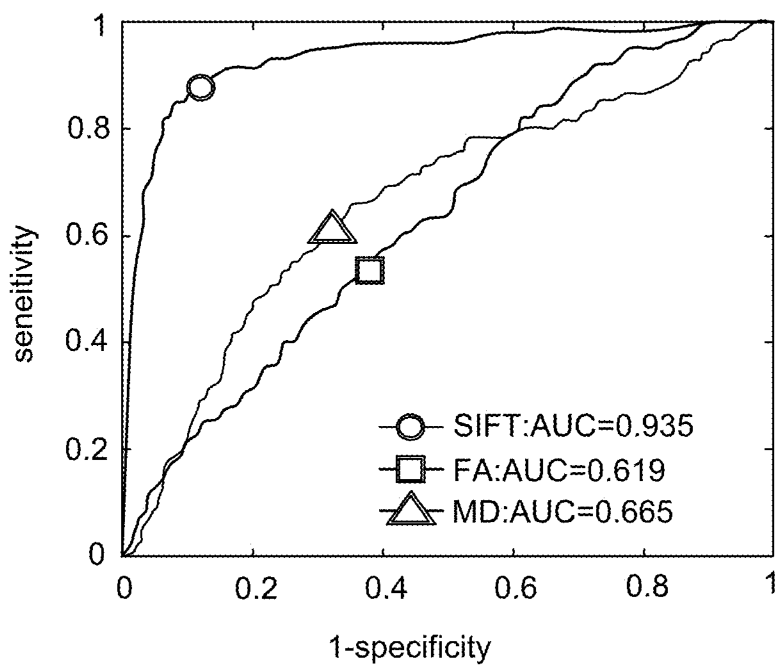
FIG. 12 is an X-Y plot of ROC of SSIFT in animals.

FIG. 12 shows pixelwise receiver operating characteristic (ROC) curves corresponding to the results shown in FIG. 11. Three different methods were used, including SSIFT, FA and mean diffusivity (MD). FIG. 12 visually depicts SSIFT's superior sensitivity to the FA and MD DTI methods, with SSIFT providing an AUC of 0.935, FA providing an AUC of 0.619, and MD providing an AUC of 0.665. Thus, SSIFT performs better than conventional imaging techniques when imaging tumors.

Monitoring Treatment Response

Figure 13:
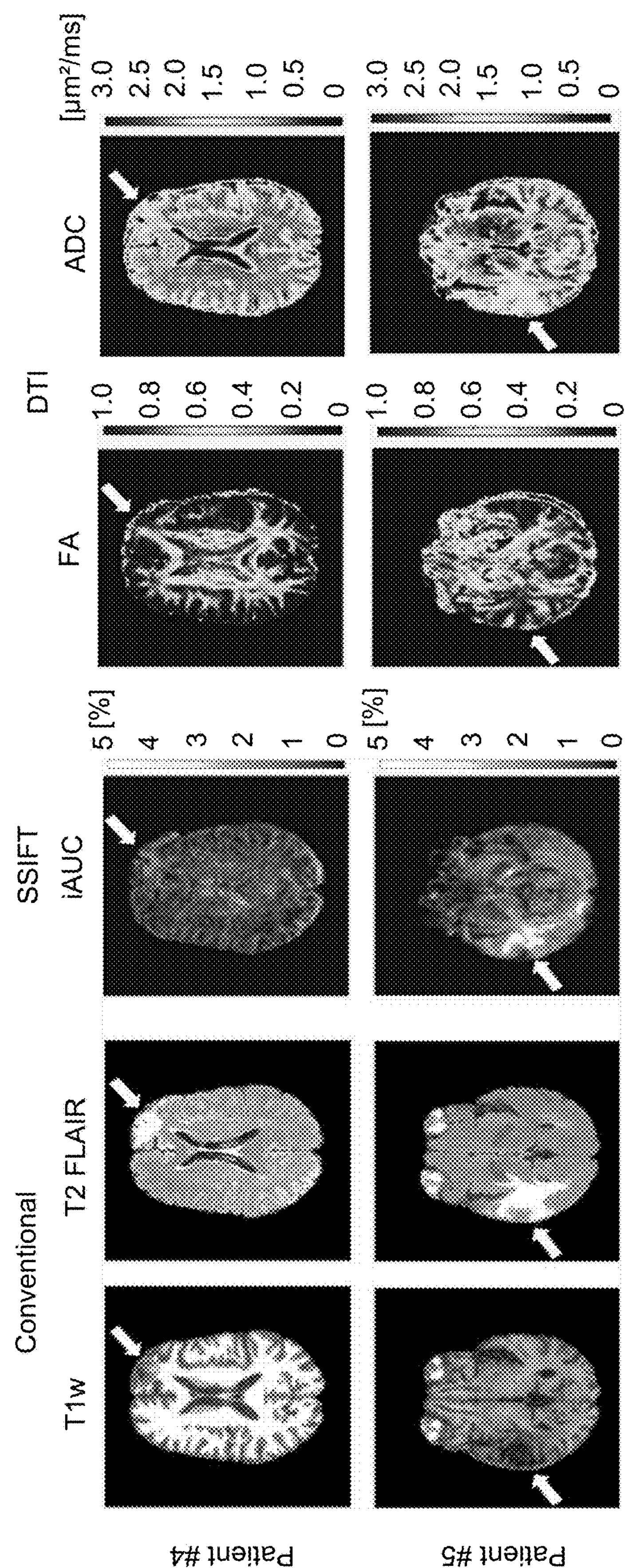
FIG. 13 shows example anatomic images of two different patients to contrast conventional MRI imaging techniques with SSIFT.

FIG. 13 shows multiple MRI parametric maps of two different patients. Patient #4 is a male, 56-year-old with renal cell carcinoma. Patient #5 is a female, 65-year-old with NSCLC. Both patients had new appearing 'lesions' in their brains several months after radiation treatment. These regions are shown by the arrows in the upper right-hand side of the images for patient #4 and the lower left-hand side of the images for patient #5. As shown in FIG. 13, both the conventional MRI images and the DTI images fail to differentiate between the lesions. Conventional scans on their own would be an inefficient tool to plan SRS treatment. SSIFT indicates that patient #4 just has radionecrosis. SSIFT found a significant amount of cancer cells in the lesion of patient #5 and even in surrounding vasogenic edema. Patient #5's tumor was confirmed with a neuropathology report as metastatic poorly differentiated carcinoma, which means that the tumor cells were spread through the lower left region of the brain image.

Figure 14:
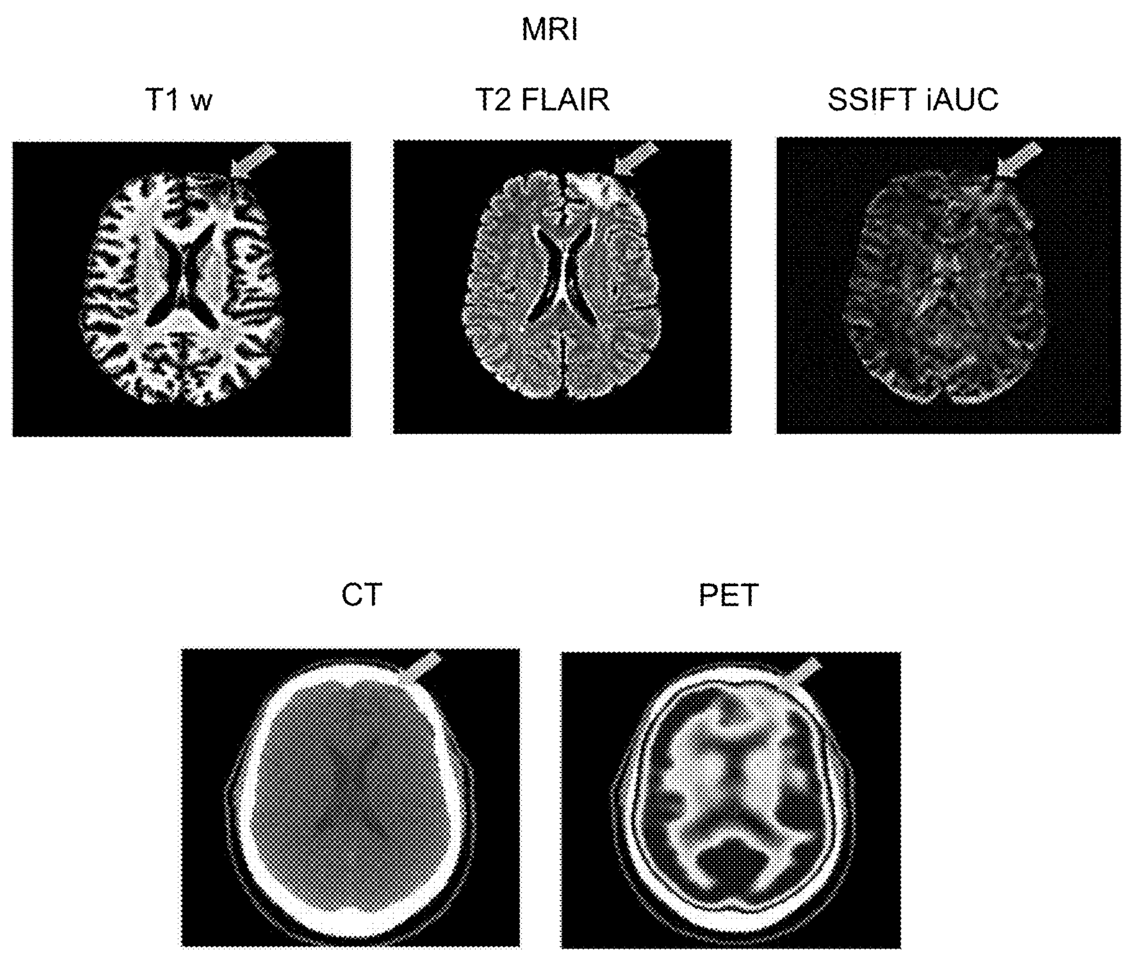
FIG. 14 shows example anatomical images compared between conventional brain imaging techniques and SSIFT.

FIG. 14 displays multimodal multi-parametric images of a renal cell carcinoma metastatic brain tumor patient with a new lesion which appeared five months after radiation treatment. The arrow in each image points to the detected distortion in the region of interest with suspicious lesion. The SSIFT scan in FIG. 14 does not show any high contrast regions where the arrow is pointing and thus predicts that the region is radionecrosis and not a recurrent tumor. Five months later, PET/CT found that the region had 'decreased metabolic activity', confirming that the region of interest was radionecrosis and not a tumor.

Figure 15:
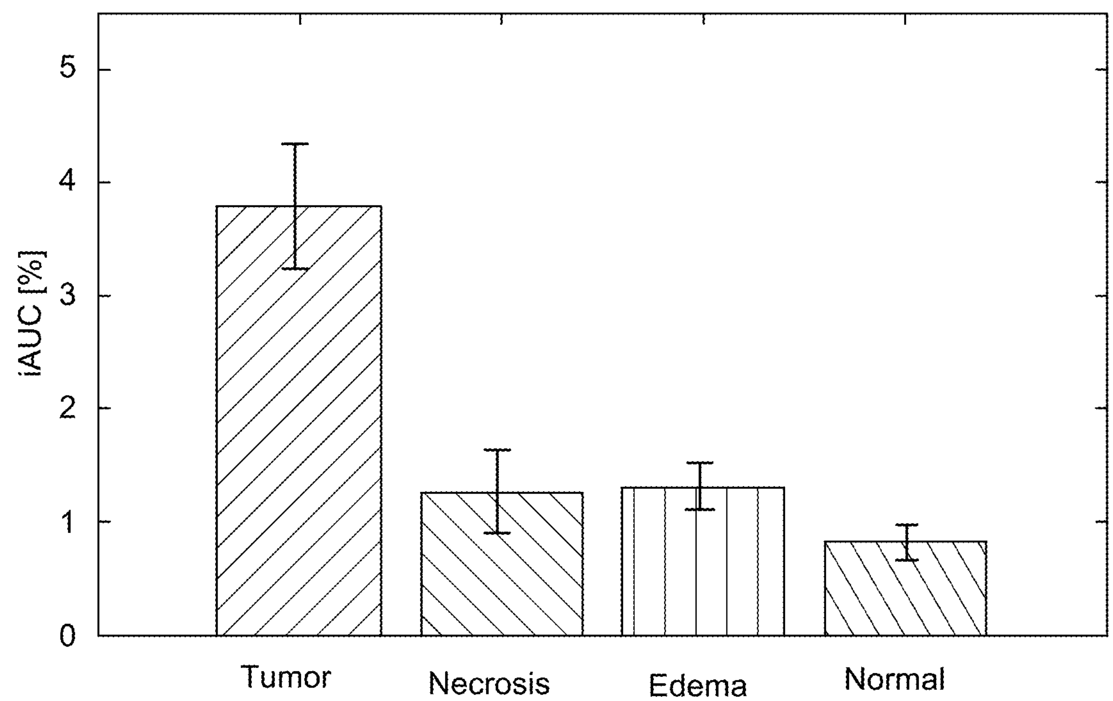
FIG. 15 shows the capability of SSIFT to differentiate tumors from other brain etiologies of patients.

FIG. 15 shows summarized SSIFT iAUC results of five patients. The results suggest significant differences between tumors and other etiologies, especially radionecrosis, can be distinguished using SSIFT iAUC while other contemporary imaging techniques currently fail to differentiate between tumors and those etiologies with BBB breakdown such as radionecrosis.

Although the above method description and applications describe the overall methodology, the present disclosure completes that various improvements are possible. The following methodologies describe some additional advancements that can be optionally included in the SSIFT process.

High Resolution MRI Scans

SRS treatment planning typically requires an MRI with a high spatial resolution. A typical acceptable range would be less than 1.5 mm isotropic for adequate conspicuity and delineation of tumors. Current DTI acquires images with a 2 mm isotropic resolution, which is not sufficient for SRS treatment planning. Additionally, whole-brain DTI acquisitions usually require relatively long scan time. Many slices (~70 slices for 2 mm slice thickness and ~110 slices for 1.25 mm slice thickness) must be acquired for the whole-brain coverage within a certain time of repetition time (TR). Multiple limitations such as gradient duty cycle and specific absorption rate (SAR) will limit the minimum TR as well as total scan time ($\sim TR \times N_{dirs}$).

The multi-band (MB) method can acquire multiple image slices simultaneously which significantly reduces the limitations on TR and hence reduce total scan time. With SSIFT, one can implement a multi-band technique for SSIFT acquisitions on an MRI scanner and can achieve an acceleration factor of 3 with a multi-band factor of 3 (see FIG. 16 below). Note that although a higher multi-band factor may further reduce TR as well as total scan time, SNR may be compromised. More importantly, TR is also limited by relaxation time because TR needs to be sufficiently long for magnetization to recover. SSIFT can use TR~5 sec with a multi-band factor of 3 or 4 on 3T MRI scanners. By combining an extra b=0 image with a reversed phase-encoding direction, a total scan time of ~7 mins for SSIFT acquisitions can be achieved. This length of time is similar to the scan time of the current standard-of-care high-resolution post-Gd T1w or T2 FLAIR.

Figure 16:
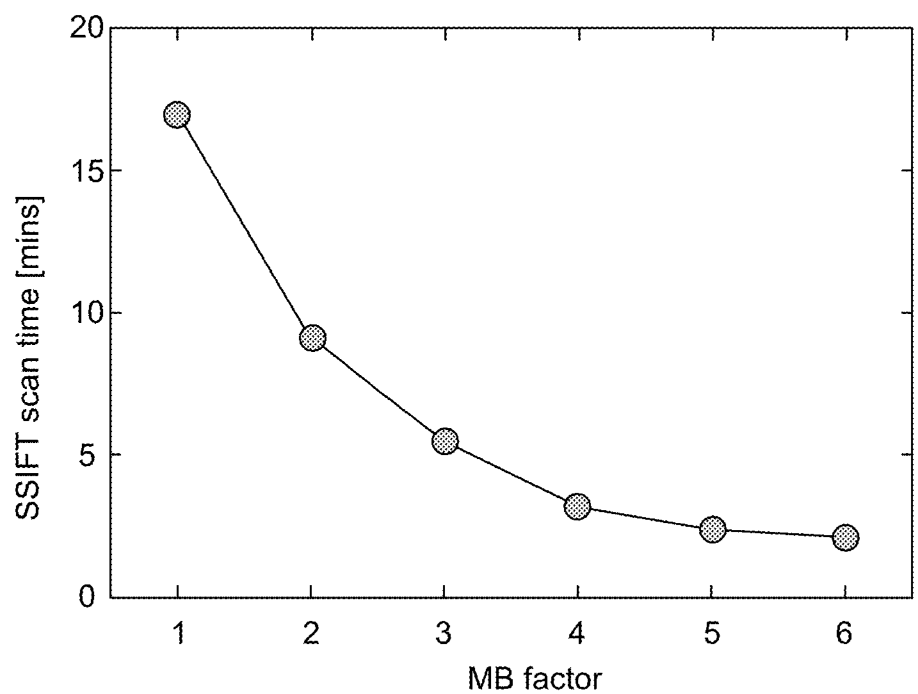
FIG. 16 is an X-Y plot showing the scan time versus the factor of a multi-band method.

FIG. 16 shows the maximum acceleration of SSIFT using different multi-band (MB) factors. In general, whole-brain DTI acquisitions usually require relatively long scan time because the imaging needs to acquire many slices of the brain to provide a whole-brain coverage. The MB method can acquire multiple image slices simultaneously which reduces significantly the total scan time and the limitations on TR. In conventional imaging techniques, TR needs to be sufficiently long for the magnetization of the MRI to recover. FIG. 16 shows that SSIFT could use a TR of approximately 5 seconds with a multi-band factor of 3 or 4 to achieve a total scan time of around 7 minutes. Conventional post-GD T1w or T2 FLAIR acquisitions have similar scan times. FIG. 16 shows the success of SSIFT in providing tissue images in a comparable amount of time to existing techniques.

MRI Acquisition Acceleration

Figure 17A:
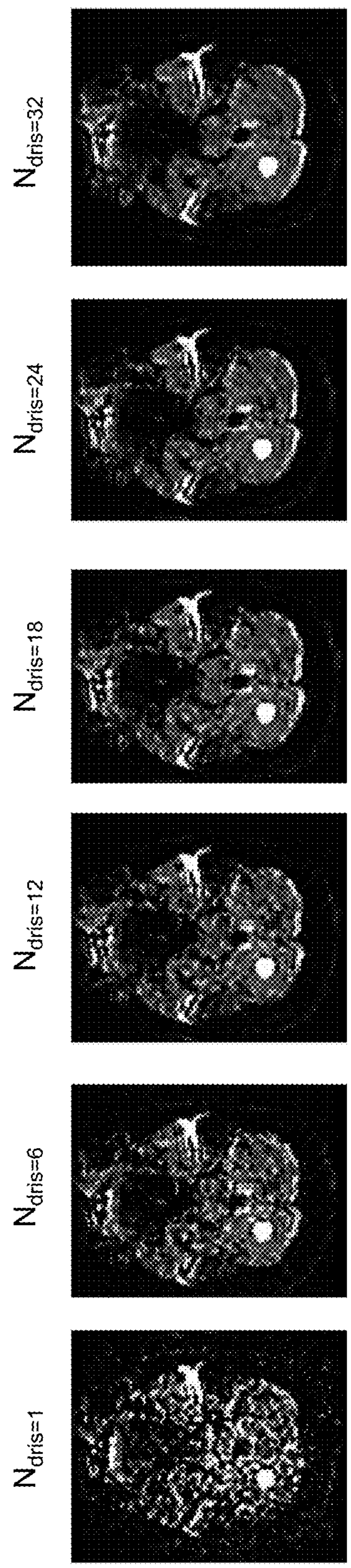
FIG. 17A shows how results from SSIFT change with the number of gradient directions.

FIG. 17A shows how SSIFT provides stable imaging results even when the number of gradient directions, $N_{dirs}$, changes. $N_{dirs}$ is an adjustable parameter that determines the signal to noise ratio (SNR) of the SSIFT imaging technique. $N_{dirs}$ is limited by the total scan time. SNR compares the level of a desired signal to the level of background noise in order to determine whether the measured signal is statistically significant. The greater the number of gradient directions, the lower the SNR, as shown by the last image in FIG. 17A.

Figure 17B:
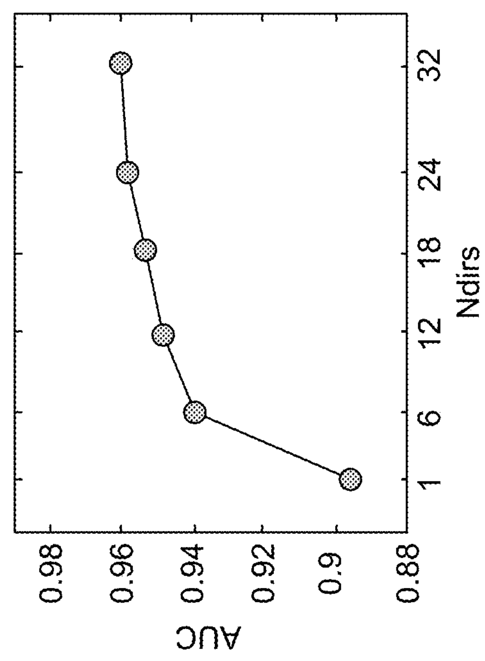
FIG. 17B is an X-Y plot of receiver operating characteristic for the area under curve versus the number of gradient directions.

FIG. 17B is an X-Y plot of the ROC based AUC of SSIFT compared to $N_{dirs}$. Even with a low $N_{dirs}$, the AUC for the embodiment still largely ranks above 0.9 which suggests that SSIFT methods will have few limitations when imaging tissue. Based on such information, SSIFT can be further accelerated using fewer gradient directions in practice.

The imaging parameters in SSIFT protocol can be further optimized to minimize total scan time for specific applications. SSIFT has multiple adjustable parameters, including $N_{dirs}$, $t_{diff}$, and b, which can be optimized to maximize the contrast-to-ratio noise within a clinically feasible time. In addition, SSIFT can use the Cramer-Rao lower bound (CRLB) approach which assesses the dependence on acquisition parameters.

Test-Retest Reliability

Figure 18:
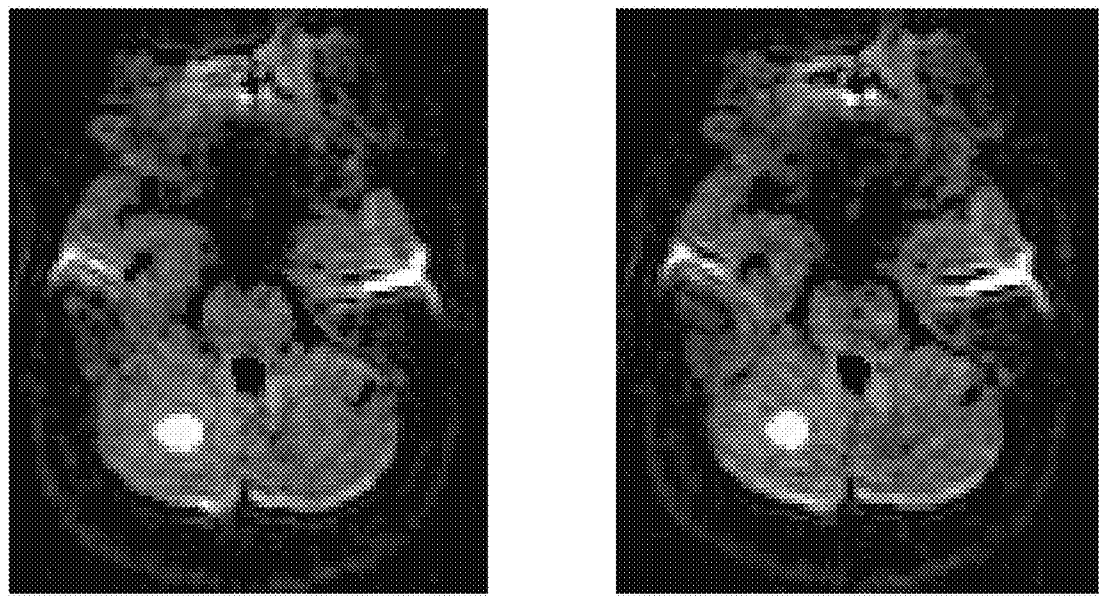
FIG. 18 shows example repeated images obtained according to SSIFT.

FIG. 18 demonstrates the test-retest reliability of SSIFT's imaging technique. FIG. 18 is an example of two repeated SSIFT measurements on a patient with NSCLC metastasis in the cerebellum. FIG. 18 shows how the conspicuity and delineation of the tumor is very similar which suggests high reliability of SSIFT. Notably, the background signal varies due to SNR.

Combination of T2-Weighted MRI Signals and iAUC Obtained Using SSIFT

Figure 19:
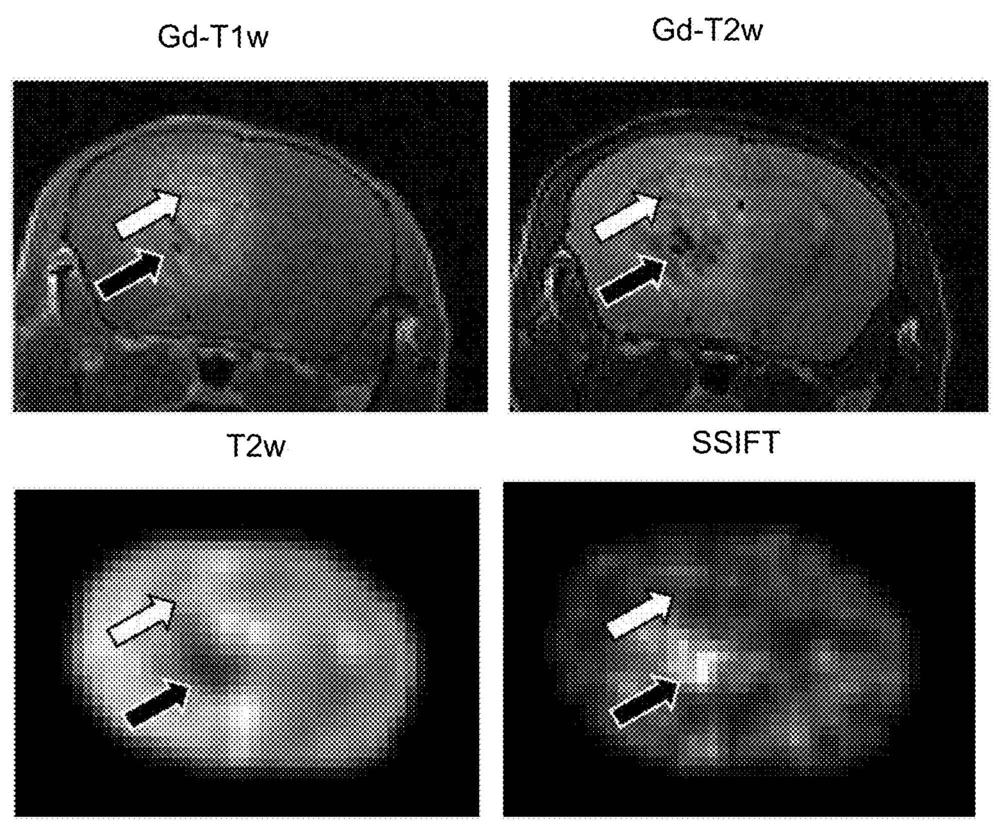
FIG. 19 shows exemplary anatomical imaging in a mouse brain bearing radionecrosis as shown through using a combination of T2-weighted MRI signals and iAUC obtained using SSIFT.

FIG. 19 shows a representative mouse brain bearing a radionecrosis. The black arrows indicate a hemorrhage region with very low T2-weighted MRI signals. The white arrow indicates the radionecrosis regions without obvious hemorrhage with relatively higher T2-weighted MRI signals. FIG. 19 shows that iAUC obtained using SSIFT can be artificially high in the hemorrhage region due to use of low T2-weighted MRI signals for normalization.

Figure 20:
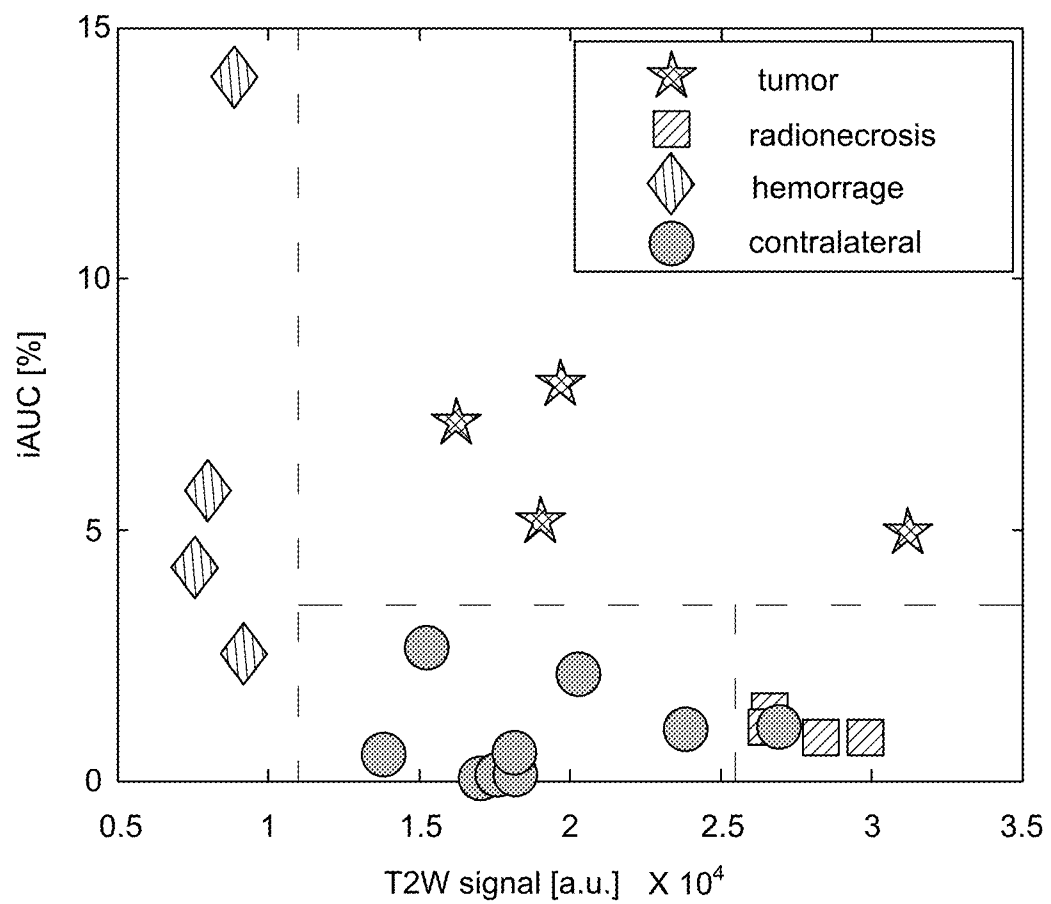
FIG. 20 shows summarized region of interest results using a combination of T2-weighted MRI signals and iAUC obtained using SSIFT.

FIG. 20 shows summarized region-of-interest based results of 4 mice with glioma tumors and 4 mice with radionecrosis. The radionecrosis shows to radiation-induced necrotic regions without obvious hemorrhage, and hemorrhage regions are identified as low T2-weighted MRI signals (as shown in FIG. 19). FIG. 20 shows that the combination of T2-weighted MRI signals and iAUC obtained using SSIFT can be used to distinguish different tissue types.

Exemplary NMR System

Figure 21:
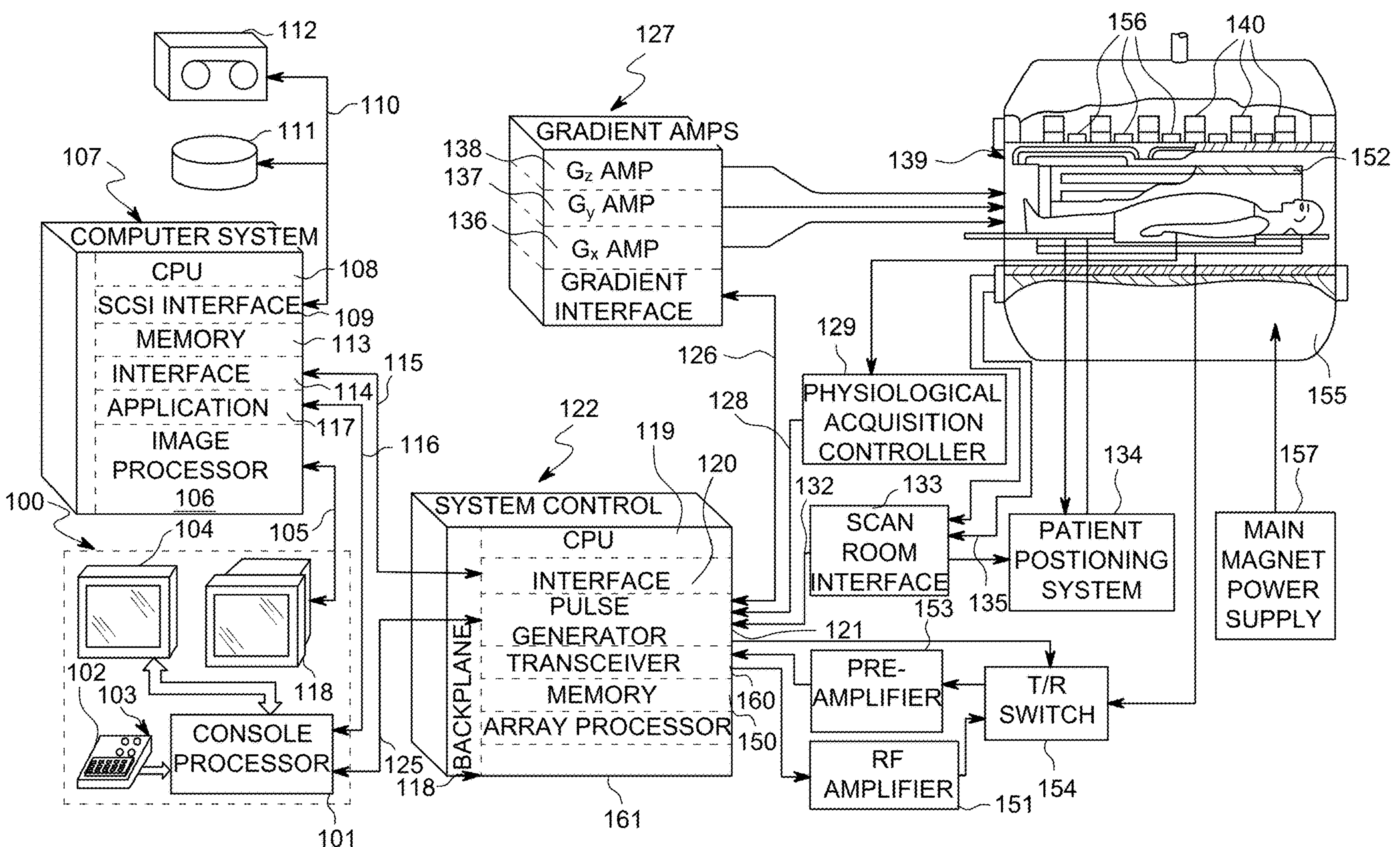
FIG. 21 is a block diagram of an MRI system used to acquire NMR data according to the various embodiments of the invention.
Figure 22:
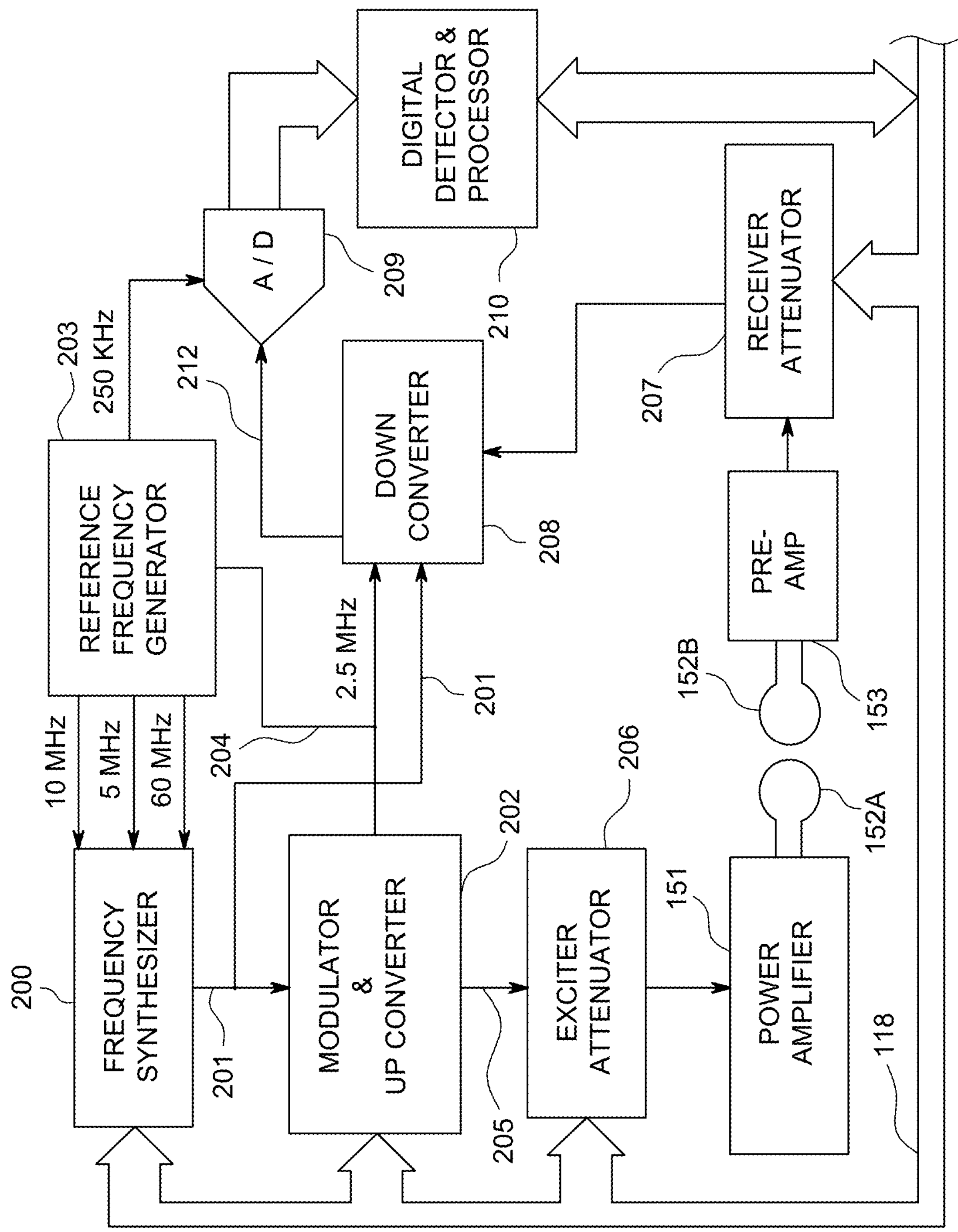
FIG. 22 is a block diagram of a transceiver which forms part of the MRI system of FIG. 22.

Referring now to FIGS. 21 and 22, the methods and embodiments of the present disclosure can be performed on an exemplary nuclear magnetic resonance ("NMR system"). As a person of ordinary skill in the art understands, NMR commonly refers to the hardware used to generate different types of scans, including MRI scans. Referring now to FIGS. 21 and 22, there is shown the major components of an NMR system which can be used to carry out the methods of the various embodiments. FIG. 22 shows the components of an exemplary transceiver for the NMR system of FIG. 21. It should be noted that the methods of the various can also be carried out using other NMR systems.

The operation of the system of FIGS. 21 and 22 is controlled from an operator console 100 which includes a console processor 101 that scans a keyboard 102 and receives inputs from a human operator through a control panel 103 and a plasma display/touch screen 104. The console processor 101 communicates through a communications link 116 with an applications interface module 117 in a separate computer system 107. Through the keyboard 102 and controls 103, an operator controls the production and display of images by an image processor 106 in the computer system 107, which connects directly to a video display 118 on the console 100 through a video cable 105.

The computer system 107 is formed about a backplane bus which conforms with the VME standards, and it includes a number of modules which communicate with each other through this backplane. In addition to the application interface 117 and the image processor 106, these include a CPU module 108 that controls the VME backplane, and an SCSI interface module 109 that connects the computer system 107 through a bus 110 to a set of peripheral devices, including disk storage 111 and tape drive 112. The computer system 107 also includes a memory module 113, known in the art as a frame buffer for storing image data arrays, and a serial interface module 114 that links the computer system 107 through a high speed serial link 115 to a system interface module 120 located in a separate system control cabinet 122.

The system control 122 includes a series of modules which are connected together by a common backplane 118. The backplane 118 is comprised of a number of bus structures, including a bus structure which is controlled by a CPU module 119. The serial interface module 120 connects this backplane 118 to the high speed serial link 115, and pulse generator module 121 connects the backplane 118 to the operator console 100 through a serial link 125. It is through this link 125 that the system control 122 receives commands from the operator which indicate the scan sequence that is to be performed.

The pulse generator module 121 operates the system components to carry out the desired scan sequence. It produces data which indicates the timing, strength and shape of the RF pulses which are to be produced, and the timing of and length of the data acquisition window. The pulse generator module 121 also connects through serial link 126 to a set of gradient amplifiers 127, and it conveys data thereto which indicates the timing and shape of the gradient pulses that are to be produced during the scan. The pulse generator module 121 also receives patient data through a serial link 128 from a physiological acquisition controller 129. The physiological acquisition control 129 can receive a signal from a number of different sensors connected to the patient. For example, it may receive ECG signals from electrodes or respiratory signals from a bellows and produce pulses for the pulse generator module 121 that synchronizes the scan with the patient's cardiac cycle or respiratory cycle. And finally, the pulse generator module 121 connects through a serial link 132 to scan room interface circuit 133 which receives signals at inputs 135 from various sensors associated with the position and condition of the patient and the magnet system. It is also through the scan room interface circuit 133 that a patient positioning system 134 receives commands which move the patient cradle and transport the patient to the desired position for the scan.

The gradient waveforms produced by the pulse generator module 121 are applied to a gradient amplifier system 127 comprised of Gx, Gy, and Gz amplifiers 136, 137 and 138, respectively. Each amplifier 136, 137, and 138 is utilized to excite a corresponding gradient coil in an assembly generally designated 139. The gradient coil assembly 139 forms part of a magnet assembly 155 which includes a polarizing magnet 140 that produces a 1.5 Tesla polarizing field that extends horizontally through a bore. The gradient coils 139 encircle the bore, and when energized, they generate magnetic fields in the same direction as the main polarizing magnetic field, but with gradients Gx, Gy and Gz directed in the orthogonal x-, y- and z-axis directions of a Cartesian coordinate system. That is, if the magnetic field generated by the main magnet 140 is directed in the z direction and is termed BO, and the total magnetic field in the z direction is referred to as Bz, then $Gx\partial Bz/\partial x$, $Gy=\partial Bz/\partial y$ and $Gz=\partial Bz/\partial z$, and the magnetic field at any point (x,y,z) in the bore of the magnet assembly 141 is given by $B(x,y,z)=Bo+Gxx+GyyGzz$. The gradient magnetic fields are utilized to encode spatial information into the NMR signals emanating from the patient being scanned. Because the gradient fields are switched at a very high speed when an EPI sequence is used to practice the preferred embodiment of the invention, local gradient coils are employed in place of the whole-body gradient coils 139. These local gradient coils are designed for the head and are in close proximity thereto. This enables the inductance of the local gradient coils to be reduced and the gradient switching rates increased as required for the EPI pulse sequence. For a description of these local gradient coils which is incorporated herein by reference, see U.S. Pat. No. 5,372,137 issued on Dec. 13, 1994 and entitled "NMR Local Coil For Brain Imaging".

Located within the bore 142 is a circular cylindrical whole-body RF coil 152. This coil 152 produces a circularly polarized RF field in response to RF pulses provided by a transceiver module 150 in the system control cabinet 122. These pulses are amplified by an RF amplifier 151 and coupled to the RF coil 152 by a transmit/receive switch 154 which forms an integral part of the RF coil assembly. Waveforms and control signals are provided by the pulse generator module 121 and utilized by the transceiver module 150 for RF carrier modulation and mode control. The resulting NMR signals radiated by the excited nuclei in the patient may be sensed by the same RF coil 152 and coupled through the transmit/receive switch 154 to a preamplifier 153. The amplified NMR signals are demodulated, filtered, and digitized in the receiver section of the transceiver 150.

The transmit/receive switch 154 is controlled by a signal from the pulse generator module 121 to electrically connect the RF amplifier 151 to the coil 152 during the transmit mode and to connect the preamplifier 153 during the receive mode. The transmit/receive switch 154 also enables a separate local RF head coil to be used in the transmit and receive mode to improve the signal-to-noise ratio of the received NMR signals. With currently available NMR systems such a local RF coil is preferred in order to detect small variations in NMR signal. Reference is made to the above cited U.S. Pat. No. 5,372,137 for a description of the preferred local RF coil.

In addition to supporting the polarizing magnet 140 and the gradient coils 139 and RF coil 152, the main magnet assembly 141 also supports a set of shim coils 156 associated with the main magnet 140 and used to correct inhomogeneities in the polarizing magnet field. The main power supply 157 is utilized to bring the polarizing field produced by the superconductive main magnet 140 to the proper operating strength and is then removed.

The NMR signals picked up by the RF coil are digitized by the transceiver module 150 and transferred to a memory module 160 which is also part of the system control 122. When the scan is completed and an entire array of data has been acquired in the memory modules 160, an array processor 161 operates to Fourier transform the data into an array of image data. This image data is conveyed through the serial link 115 to the computer system 107 where it is stored in the disk memory 111. In response to commands received from the operator console 100, this image data may be archived on the tape drive 112, or it may be further processed by the image processor 106 and conveyed to the operator console 100 and presented on the video display 118 as will be described in more detail hereinafter.

Referring particularly to FIG. 22, the transceiver 150 includes components which produce the RF excitation field B1 through power amplifier 151 at a coil 152A and components which receive the resulting NMR signal induced in a coil 152B. As indicated above, the coils 152A and B may be a single whole-body coil, but the best results are achieved with a single local RF coil specially designed for the head. The base, or carrier, frequency of the RF excitation field is produced under control of a frequency synthesizer 200 which receives a set of digital signals (CF) through the backplane 118 from the CPU module 119 and pulse generator module 121. These digital signals indicate the frequency and phase of the RF carrier signal which is produced at an output 201. The commanded RF carrier is applied to a modulator and up converter 202 where its amplitude is modulated in response to a signal R(t) also received through the backplane 118 from the pulse generator module 121. The signal R(t) defines the envelope, and therefore the bandwidth, of the RF excitation pulse to be produced. It is produced in the module 121 by sequentially reading out a series of stored digital values that represent the; desired envelope. These stored digital values may, in turn, be changed from the operator console 100 to enable any desired RF pulse envelope to be produced. The modulator and up converter 202 produces an RF pulse at the desired Larmor frequency at an output 205. The magnitude of the RF excitation pulse output through line 205 is attenuated by an exciter attenuator circuit 206 which receives a digital command, TA, from the backplane 118. The attenuated RF excitation pulses are applied to the power amplifier 151 that drives the RF coil 152A. For a more detailed description of this portion of the transceiver 122, reference is made to U.S. Pat. No. 4,952,877 which is incorporated herein by reference.

Referring still to FIGS. 21 and 22, the NMR signal produced by the subject is picked up by the receiver coil 152B and applied through the preamplifier 153 to the input of a receiver attenuator 207. The receiver attenuator 207 further amplifies the NMR signal and this is attenuated by an amount determined by a digital attenuation signal (RA) received from the backplane 118. The receive attenuator 207 is also turned on and off by a signal from the pulse generator module 121 such that it is not overloaded during RF excitation. The received NMR signal is at or around the Larmor frequency, which in the preferred embodiment is around 63.86 MHz for 1.5 Tesla. This high frequency signal is down converted in a two-step process by a down converter 208 which first mixes the NMR signal with the carrier signal on line 201 and then mixes the resulting difference signal with the 2.5 MHz reference signal on line 204. The resulting down converted NMR signal on line 212 has a maximum bandwidth of 125 kHz and it is centered at a frequency of 187.5 kHz. The down converted NMR signal is applied to the input of an analog-to-digital (A/D) converter 209 which samples and digitizes the analog signal at a rate of 250 kHz. The output of the A/D converter 209 is applied to a digital detector and signal processor 210 which produce 16-bit in-phase (1) values and 16-bit quadrature (Q) values corresponding to the received digital signal. The resulting stream of digitized I and Q values of the received NMR signal is output through backplane 118 to the memory module 160 where they are employed to reconstruct an image.

To preserve the phase information contained in the received NMR signal, both the modulator and up converter 202 in the exciter section and the down converter 208 in the receiver section are operated with common signals. More particularly, the carrier signal at the output 201 of the frequency synthesizer 200 and the 2.5 MHz reference signal at the output 204 of the reference frequency generator 203 are employed in both frequency conversion processes. Phase consistency is thus maintained and phase changes in the detected NMR signal accurately indicate phase changes produced by the excited spins. The 2.5 MHz reference signal as well as 5, 10 and 60 MHz reference signals are produced by the reference frequency generator 203 from a common 20 MHz master clock signal. The latter three reference signals are employed by the frequency synthesizer 200 to produce the carrier signal on output 201. For a more detailed description of the receiver, reference is made to U.S. Pat. No. 4,992,736 which is incorporated herein by reference.

While various embodiments of the present invention have been described above, it should be understood that they have been presented by way of example only, and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations and modifications will occur to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

The terminology used herein is for the purpose of describing particular embodiments only and is not intended to be limiting of the invention. As used herein, the singular forms "a", "an" and "the" are intended to include the plural forms as well, unless the context clearly indicates otherwise. Furthermore, to the extent that the terms "including", "includes", "having", "has", "with", or variants thereof are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

What is claimed is:

1. A method of evaluating biological tissues using magnetic resonance imaging (MRI), comprising:

obtaining first diffusion MRI data for biological tissues of interest;

obtaining at least one second diffusion MRI data for the biological tissues of interest having an identical b-value as the first diffusion MRI data and a different diffusion time than the first diffusion MRI data;

calculating, from the first and at least one second diffusion MRI data, incremental area under curve values of the first and at least one second diffusion MRI data for a chosen diffusion time range; and generating an image for the biological tissues of interest comprising a plurality of image voxels, wherein intensity values for each of the plurality of image voxels is based on a corresponding one of the incremental area under curve values.

2. The method of claim 1, wherein the at least one second diffusion MRI data has a same degree of diffusion weighting and echo time as the first diffusion MRI data.

3. The method of claim 1, wherein obtaining the diffusion MRI data for the first and the at least one second diffusion MRI further comprises:

calculating the total diffusion MRI signal based on a pre-defined function of a local diffusion tensor based on a diffusion gradient direction, a water fraction, and an angle between a rate of diffusion and a gradient direction of diffusion.

4. The method of claim 1, wherein the at least one second diffusion MRI data has one or more different diffusion gradient directions than the first diffusion MRI data.

5. The method of claim 4, wherein the method further comprises:

prior to calculating the incremental area under curve, calculating the average of diffusion weighted signals between the one or more different diffusion gradient directions to obtain a direction-averaged signal.

6. The method of claim 5, wherein calculating the average diffusion weighted signal comprises solving:

$$M_n(t_{diff}) = \sum_{n}^{N_{compt}} \sum_{k}^{N_{dirs}} S_{n,k}(t_{diff}) =$$

-continued $$\sum_{n}^{N_{compt}} f_n \exp(-b\lambda_{\perp,n}(t_{diff})) \frac{\sqrt{\pi}\, erf\left(\sqrt{b(\lambda_{//,n}(t_{diff}) - \lambda_{\perp,n}(t_{diff}))}\right)}{2\sqrt{b(\lambda_{//,n}(t_{diff}) - \lambda_{\perp,n}(t_{diff}))}}$$

where $N_{dirs}$ the number of gradient directions, $N_{compt}$ is the number of diffusion compartments in the imaging voxel, $t_{diff}$ is the diffusion time, $\lambda_\perp$ is the radial diffusivity, $\lambda_{||}$ is the axial diffusivity, b is the degree of diffusion weighting, and $f_n$ is the water fraction.

7. The method of claim 1, wherein each of the first diffusion MRI data and the at least one second diffusion MRI data are obtained using a diffusion gradient waveform, and wherein the diffusion gradient waveform comprises one of a pulsed gradient spin echo waveform, an oscillating gradient spin echo waveform, and stimulated echo acquisition mode diffusion waveform.

8. The method of claim 7, wherein the diffusion gradient waveform for the first diffusion MRI data and the at least one second diffusion MRI data are different.

9. The method of claim 1, wherein calculating the incremental area under curve comprises solving:

$$iAUC = iAUC(b=1000) - iAUC(b=250);$$

where b is the degree of diffusion weighting, and b=1000 and 250 s/mm$^2$ are two suggested values and could be other values.

10. A non-transitory computer-readable storage medium having stored thereon a computer program executable by a computing device, the computer program comprising a plurality of code sections for cause the computing device to perform the steps of:

obtaining first diffusion MRI data for biological tissues of interest;

obtaining at least one second diffusion MRI data for the biological tissues of interest having a different diffusion time than the first diffusion MRI data;

calculating, from the first and at least one second diffusion MRI data, incremental area under curve values of the first and at least one second diffusion MRI data for a chosen diffusion time range; and generating an image for the biological tissues of interest comprising a plurality of image voxels, wherein intensity values for each of the plurality of image voxels is based on a corresponding one of the incremental area under curve values.

11. The non-transitory computer-readable storage medium of claim 10, wherein the at least one second diffusion MRI data has a same degree of diffusion weighting and echo time as the first diffusion MRI data.

12. The non-transitory computer-readable storage medium of claim 10, wherein obtaining the diffusion MRI data for the first and the at least one second diffusion MRI further comprises:

calculating the total diffusion MRI signal based on a pre-defined function for calculating a local diffusion tensor based on a diffusion gradient direction, a water fraction, and an angle between a rate of diffusion and a gradient direction of diffusion.

13. The non-transitory computer-readable storage medium of claim 10, wherein the at least one second diffusion MRI data has one or more different diffusion gradient directions than the first diffusion MRI data.

14. The non-transitory computer-readable storage medium of claim 13, wherein the method further comprises:

prior to calculating the incremental area under curve, calculating the average of diffusion weighted signals between the one or more different diffusion gradient directions to obtain a direction-averaged signal.

15. The non-transitory computer-readable storage medium of claim 14, wherein calculating the average diffusion weighted signal comprises solving:

$$M_n(t_{diff}) = \sum_{n}^{N_{compt}} \sum_{k}^{N_{dirs}} S_{n,k}(t_{diff}) = \sum_{n}^{N_{compt}} f_n \exp(-b\lambda_{\perp,n}(t_{diff})) \frac{\sqrt{\pi}\, erf\left(\sqrt{b(\lambda_{//,n}(t_{diff}) - \lambda_{\perp,n}(t_{diff}))}\right)}{2\sqrt{b(\lambda_{//,n}(t_{diff}) - \lambda_{\perp,n}(t_{diff}))}}$$

where $N_{dirs}$ the number of gradient directions, $N_{compt}$ is the number of diffusion compartments in the imaging voxel, $t_{diff}$ is the diffusion time, $\lambda_{\perp}$ is the radial diffusivity, $\lambda_{\|}$ is the axial diffusivity, b is the degree of diffusion weighting, and $f_n$ is the water fraction.

16. A system comprising:

a processor;

non-transitory computer-readable storage medium having stored thereon a computer program executable by the processor, the computer program comprising a plurality of code sections for cause the processor to perform the steps of:

obtaining first diffusion MRI data for biological tissues of interest;

obtaining at least one second diffusion MRI data for the biological tissues of interest having a different diffusion time than the first diffusion MRI data;

calculating, from the first and at least one second diffusion MRI data, incremental area under curve values of the first and at least one second diffusion MRI data for a chosen diffusion time range; and generating an image for the biological tissues of interest comprising a plurality of image voxels, wherein intensity values for each of the plurality of image voxels is based on a corresponding one of the incremental area under curve values.

17. The system of claim 16, wherein the at least one second diffusion MRI data has a same degree of diffusion weighting and echo time as the first diffusion MRI data.

18. The system of claim 16, wherein obtaining the diffusion MRI data for the first and the at least one second diffusion MRI further comprises:

calculating the total diffusion MRI signal based on a pre-defined function for calculating a local diffusion tensor based on a diffusion gradient direction, a water fraction, and an angle between a rate of diffusion and a gradient direction of diffusion.

19. The system of claim 16, wherein the at least one second diffusion MRI data has one or more different diffusion gradient directions than the first diffusion MRI data.

20. The system of claim 19, wherein the method further comprises:

prior to calculating the incremental area under curve, calculating the average of diffusion weighted signals between the one or more different diffusion gradient directions to obtain a direction-averaged signal.

* * * * *